(12) United States Patent
Tsai et al.

(10) Patent No.: US 12,125,960 B2
(45) Date of Patent: Oct. 22, 2024

(54) ELECTRONIC DEVICE

(71) Applicant: InnoLux Corporation, Miao-Li County (TW)

(72) Inventors: Tsung-Han Tsai, Miao-Li County (TW); Kuan-Feng Lee, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/150,516

(22) Filed: Jan. 5, 2023

(65) Prior Publication Data
US 2023/0155097 A1 May 18, 2023

Related U.S. Application Data

(63) Continuation of application No. 16/924,447, filed on Jul. 9, 2020, now Pat. No. 11,569,423, which is a
(Continued)

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 25/167* (2013.01); *H01L 27/1214* (2013.01); *H01L 33/06* (2013.01); *H01L 33/32* (2013.01); *H01L 33/505* (2013.01); *H01L 33/54* (2013.01); *H01L 33/60* (2013.01);
(Continued)

(58) Field of Classification Search
None
See application file for complete search history.

(56) References Cited

U.S. PATENT DOCUMENTS

| | | |
|---|---|---|
| 9,391,051 B2 | 7/2016 | Rhee |
| 10,236,336 B2 | 3/2019 | Oooka |

(Continued)

FOREIGN PATENT DOCUMENTS

| | | |
|---|---|---|
| JP | 2014-186844 A | 10/2014 |
| KR | 2009-0073600 A | 7/2009 |

(Continued)

OTHER PUBLICATIONS

Korean language office action dated Apr. 13, 2024, issued in application No. KR 10-2023-0117471.

*Primary Examiner* — Robert K Carpenter
(74) *Attorney, Agent, or Firm* — McClure, Qualey & Rodack, LLP

(57) ABSTRACT

An electronic device is provided. The electronic device includes a substrate, a driving circuit, a diode and a light shielding element. The driving circuit is disposed on the substrate. The diode is electrically connected to the driving circuit. The light shielding element overlaps the substrate. A surface of the light shielding element has a first width. A cross-sectional-surface of a portion of the light shielding element has a second width. In addition, the second width is greater than the first width in a cross-sectional view, and the surface is closer to the substrate than the cross-sectional surface of the portion.

5 Claims, 18 Drawing Sheets

Related U.S. Application Data continuation of application No. 16/222,136, filed on Dec. 17, 2018, now Pat. No. 10,749,090, which is a continuation of application No. 15/855,062, filed on Dec. 27, 2017, now Pat. No. 10,193,042.

(51) Int. Cl.
*H01L 25/16* (2023.01)
*H01L 27/12* (2006.01)
*H01L 33/06* (2010.01)
*H01L 33/32* (2010.01)
*H01L 33/50* (2010.01)
*H01L 33/54* (2010.01)
*H01L 33/60* (2010.01)
*H01L 23/31* (2006.01)
*H01L 33/48* (2010.01)

(52) U.S. Cl.
CPC ........ *H01L 23/3185* (2013.01); *H01L 33/486* (2013.01); *H01L 33/507* (2013.01)

(56) References Cited

U.S. PATENT DOCUMENTS

2006/0197086 A1* 9/2006 Rhee .................... H10K 59/122
257/E29.147
2018/0122836 A1* 5/2018 Kang ...................... H01L 33/60

FOREIGN PATENT DOCUMENTS

| KR | 2014-0025055 A | 3/2014 |
| KR | 2015-0108650 A | 9/2015 |

* cited by examiner

ELECTRONIC DEVICE

CROSS REFERENCE TO RELATED APPLICATIONS

This application is a Continuation of pending U.S. Ser. No. 16/924,447, filed on Jul. 9, 2020 (now U.S. Pat. No. 11,569,423, issued Jan. 31, 2023), which is a Continuation of application Ser. No. 16/222,136, filed on Dec. 17, 2018 (now U.S. Pat. No. 10,749,090, issued Aug. 18, 2020), which is a Continuation of application Ser. No. 15/855,062, filed on Dec. 27, 2017 (now U.S. Pat. No. 10,193,042, issued Jan. 29, 2019), the entirety of which are incorporated by reference herein.

BACKGROUND

Technical Field

The present disclosure relates to a display device. The disclosure in particular relates to a protective layer of the display device.

Description of the Related Art

Electronic products that come with a display panel, such as smartphones, tablets, notebooks, monitors, and TVs, have become indispensable necessities in modern society. With the flourishing development of such portable electronic products, consumers have higher expectations regarding the quality, the functionality, and the price of such products. The development of next-generation display devices has been focused on techniques that are energy saving and environmentally friendly.

Light-emitting diodes (LEDs) based upon gallium nitride (GaN) are expected to be used in future high-efficiency lighting applications, replacing incandescent and fluorescent lighting lamps. Current GaN-based LED devices are prepared by heteroepitaxial growth techniques on substrate materials. A typical wafer level LED device structure may include a lower n-doped GaN layer formed over a sapphire substrate, a single quantum well (SQW) or multiple quantum well (MWQ), and an upper p-doped GaN layer.

Micro-LED technology is an emerging flat panel display technology. Micro LED displays drives an array of addressed micro LEDs. In the current manufacturing method, micro LEDs are formed and diced into several micro LED dies (e.g., micro-lighting dies). The driving circuits and related circuits are formed on the glass substrate to provide an array substrate (e.g., TFT array substrate), and the micro LED dies are then mounted on the array substrate. Bare dies are commonly used in micro LEDs, wherein the bare dies are surrounded by a protective layer such as an anisotropic conductive film (ACF) layer. An ACF layer may serve as a conductive route between the electrode of micro LED and the TFT array substrate. Typically, the top surface of an ACF layer is level with that of a micro LED so as to provide protection. However, this results in a waste of ACF material and it limits the space for filling the light conversion layer. In addition, conductive particles having varying sizes in the ACF layer may also lead to poor conductivity or poor reflectivity.

Accordingly, it is desirable to develop a design that employs protective layers, which can effectively maintain or improve the performance of LED structures.

SUMMARY

In accordance with some embodiments of the present disclosure, an electronic device is provided. The electronic device includes a substrate, a driving circuit, a diode and a light shielding element. The driving circuit is disposed on the substrate. The diode is electrically connected to the driving circuit. The light shielding element overlaps the substrate. A surface of the light shielding element has a first width. A cross-sectional-surface of a portion of the light shielding element has a second width. In addition, the second width is greater than the first width in a cross-sectional view, and the surface is closer to the substrate than the cross-sectional surface of the portion.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
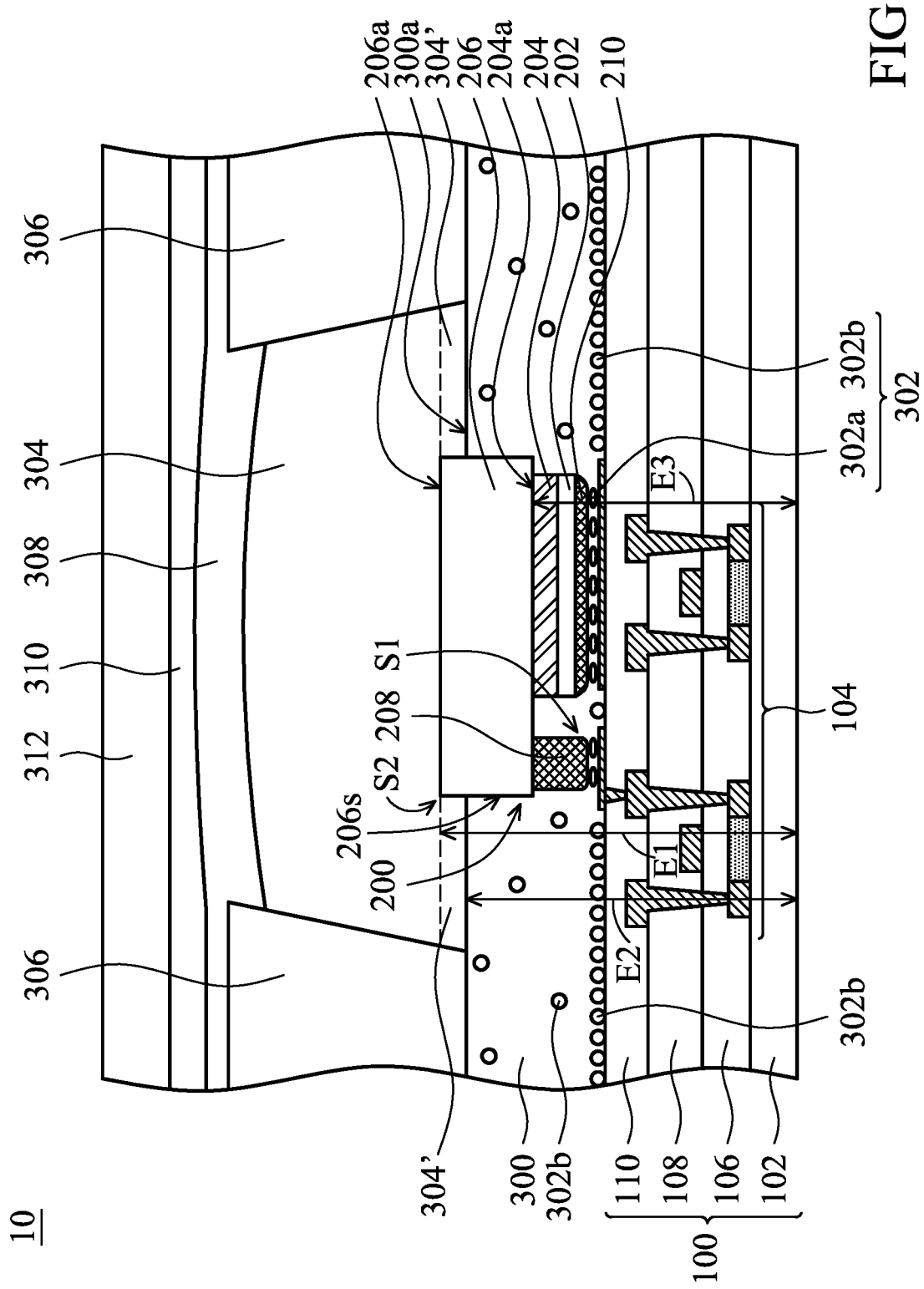
FIGS. 1A-1C illustrate the cross-sectional views of the display device in accordance with some embodiments of the present disclosure.

The display device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "about" and "substantially" typically mean+/− 20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "elevation" used herein means the distance from a substrate to a target surface. In particular, the term "elevation" may refer to the distance from a substantially planar region of a substrate to a target surface. For example, in accordance with some embodiments illustrated herein, an evaluation may refer to the distance from the bottom surface of a substrate to a target surface.

The display device provided in the present disclosure includes a protective layer having the elevation that is lower than the elevation of the upper semiconductor layer of the light-emitting unit (e.g., LED, micro LED and so on). In this case, less material is required for the protective layer compared to general display devices where the elevation of the protective layer is level with that of the upper semiconductor layer. In addition, there will be more space for the wavelength conversion layer, which is disposed over the protective layer, to fill in. In accordance with some embodiments of the present disclosure, the display device includes the protective layer having the elevation that is higher than the elevation of the quantum well of the light-emitting unit so as to prevent moisture and oxygen from damaging the quantum well. Furthermore, the protective layer of such a design may also prevent shorts or increase the reflectivity. Moreover, in accordance with some embodiments of the present disclosure, the display device includes a buffer layer disposed between the light emitting unit and the wavelength conversion layer so that the wavelength conversion layer may be unaffected by the current or heat produced by the light emitting-unit.

FIG. 1A illustrates a cross-sectional view of the display device 10 in accordance with some embodiments of the present disclosure. It should be understood that additional features may be added to the display device in some embodiments of the present disclosure. In another embodiment of the present disclosure, some of the features described below may be replaced or eliminated.

Referring to FIG. 1A, the display device 10 may include a driving substrate 100, a light-emitting unit 200 and a first protective layer 300. The driving substrate 100 may include a substrate 102, a driving circuit 104, a gate dielectric layer 106, a first insulating layer 108 and a second insulating layer 110. The driving substrate 100 may serve as a switch of the light-emitting unit 200. As shown in FIG. 1A, the driving circuit 104 is disposed on the substrate 102. In some embodiments of the present disclosure, the substrate 102 may include, but is not limited to, glass, quartz, sapphire, polycarbonate (PC), polyimide (PI), polyethylene terephthalate (PET), rubbers, glass fibers, other polymer materials, any other suitable substrate material, or a combination thereof. In some other embodiments of the present disclosure, the substrate 102 may be made of a metal-glass fiber composite plate, a metal-ceramic composite plate, a printed circuit board, or any other suitable material, but it is not limited thereto. It should be understood that although the driving circuit 104 in some embodiments as illustrated in figures is an active driving circuit including thin-film transistors (TFT), the driving circuit 104 may be a passive driving circuit in accordance with another embodiment. In some embodiments, the driving circuit 104 may be controlled by an IC or a microchip. For example, in this embodiment, the driving circuit 104 may include the conductive layer, the insulating layer and the active layer, which serve as a TFT. The active layer may include semiconductor materials such as amorphous silicon, polysilicon or metal oxide. The active layer may include a pair of source/drain regions doped with suitable dopants and an undoped channel region formed between the source/drain regions.

The gate dielectric layer 106, the first insulating layer 108 and the second insulating layer 110 are sequentially disposed on the substrate 102. The driving circuit 104 may be surrounded by the gate dielectric layer 106, the first insulating layer 108 and the second insulating layer 110. In some embodiments of the present disclosure, the material of the gate dielectric layer 106 may include silicon oxide, silicon nitride, silicon oxynitride, high-k dielectric material, any other suitable dielectric material, or a combination thereof. The high-k dielectric material may include, but is not limited to, metal oxide, metal nitride, metal silicide, transition metal oxide, transition metal nitride, transition metal silicide, metal oxynitride, metal aluminate, zirconium silicate, zirconium aluminate. In some embodiments of the present disclosure, the materials of the first insulating layer 108 or the second insulating layer 110 may be formed of an organic material, an inorganic material or a combination thereof. The organic material may include, but is not limited to, an acrylic or methacrylic organic compound, isoprene compound, phenol-formaldehyde resin, benzocyclobutene (BCB), PECB (perfluorocyclobutane) or a combination thereof. The inorganic material may include, but is not limited to, silicon nitride, silicon oxide, or silicon oxynitride or a combination thereof.

In some embodiments of the present disclosure, the gate dielectric layer 106, the first insulating layer 108 or the second insulating layer 110 may be formed by using chemical vapor deposition or spin-on coating. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method.

Still referring to FIG. 1A, the light-emitting unit 200 may be disposed on the driving substrate 100. The light-emitting unit 200 may be disposed on the driving circuit 104 and electrically connected to the driving circuit 104. Specifically, the light-emitting unit 200 may be coupled to the driving circuit 104 through the vias and the pads. The light-emitting unit 200 may include a first semiconductor layer 202, a quantum well layer 204 disposed on the first semiconductor layer 202 and a second semiconductor layer 206 disposed on the quantum well layer 204. The light-emitting unit 202 may include LED or micro LED. In accordance with some embodiments of the present disclosure, the cross-sectional area of the light emitting unit 200 may have a length of about 1 μm to about 150 μm and may have a width ranging from about 1 μm to about 150 μm. In some embodiments, the light emitting unit 200 may have a size ranging from about 1 μm×1 μm×1 μm to about 150 μm×150 μm×150 μm.

In some embodiments of the present disclosure, the first semiconductor layer 202 may be formed of the III-V compounds having dopants of the first conductivity type, e.g. gallium nitride having p-type conductivity (p-GaN). In some embodiments of the present disclosure, the quantum well layer 204 may include a homogeneous interface, a heterogeneous interface, a single quantum well (SQW) or a multiple quantum well (MQW). The material of the quantum well layer 204 may include, but is not limited to, indium gallium nitride, a gallium nitride or a combination thereof. In some embodiments of the present disclosure, the second semiconductor layer 206 may be formed of the III-V compounds having dopants of the second conductivity type, e.g. gallium nitride having n-type conductivity (n-GaN). In addition, the above III-V compounds may include, but is not limited to, indium nitride (InN), aluminum nitride (AlN), indium gallium nitride (InGaN), aluminum gallium nitride (AlGaN), aluminum indium gallium nitride (AlGaInN) or a combination thereof.

In some embodiments of the present disclosure, the first semiconductor layer 202, the quantum well layer 204 or the second semiconductor layer 206 may be formed by using an epitaxial growth process. For example, metal organic chemical vapor deposition (MOCVD), molecular beam epitaxy (MBE), hydride vapor phase epitaxy (HYPE), liquid phase epitaxy (LPE), or another suitable process may be used to form the first semiconductor layer 202, the quantum well layer 204 or the second semiconductor layer 206.

The light-emitting unit 200 may further include a first electrode 208 and a second electrode 210. In accordance with some embodiments of the present disclosure, the first electrode 208 and the second electrode 210 may serve as the n-electrode and p-electrode of the light-emitting unit 200. In some embodiments, the first electrode 208 and/or the second electrode 210 may be formed of metallic conductive materials, transparent conductive materials or a combination thereof. The metallic conductive material may include, but is not limited to, copper, aluminum, tungsten, titanium, gold, platinum, nickel, copper alloys, aluminum alloys, tungsten alloys, titanium alloys, gold alloys, platinum alloys, nickel alloys, any other suitable metallic conductive materials, or a combination thereof. The transparent conductive material may include transparent conductive oxides (TCO). For example, the transparent conductive material may include, but is not limited to, indium tin oxide (ITO), tin oxide (SnO), zinc oxide (ZnO), indium zinc oxide (IZO), indium gallium zinc oxide (IGZO), indium tin oxide (ITZO), antimony tin oxide (ATO), antimony zinc oxide (AZO), any other suitable transparent conductive materials, or a combination thereof. In some embodiments of the present disclosure, the first electrode 208 and the second electrode 210 may be formed by, but is not limited to, chemical vapor deposition, physical vapor deposition, electroplating process, electroless plating process, any other suitable processes, or a combination thereof. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method. The physical vapor deposition may include, but is not limited to, sputtering, evaporation, pulsed laser deposition (PLD), or any other suitable method.

Still referring to FIG. 1A, the first protective layer 300 is disposed on the driving substrate 100 and adjacent to light-emitting unit 200. In other words, the light-emitting unit 200 is surrounded by the first protective layer 300. The first protective layer 300 may prevent moisture or oxygen from damaging the quantum well layer 204 of the light-emitting unit 200. In some embodiments of the present disclosure, the first protective layer 300 may be transparent or semi-transparent to the visible wavelength so as to not significantly degrade the light extraction efficiency of the display device. The first protective layer 300 may be formed of organic materials or inorganic materials. In some embodiments, the inorganic material may include, but is not limited to, silicon nitride, silicon oxide, silicon oxynitride, aluminum oxide, any other suitable protective materials, or a combination thereof. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS), any other suitable protective materials, or a combination thereof.

In some embodiments of the present disclosure, the first protective layer 300 may be formed by using chemical vapor deposition (CVD), spin-on coating or printing. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method.

In addition, the first protective layer 300 may further include a plurality of conductive elements 302 formed therein. As shown in FIG. 1A, some of the conductive elements 302 may be dispersed in the first protective layer 300, and some of the conductive elements 302 may be formed on the second insulating layer 110 in accordance with some embodiments of the present disclosure. In particular, the conductive elements 302 may further include the first conductive elements 302a and the second conductive elements 302b. The first conductive elements 302a are disposed underneath a first terminal S1 of the light-emitting unit 200. The first terminal S1 is opposed to a second terminal S2. In some embodiments, the first terminal S1 and the second terminal S2 may refer to the bottom and the top of the light-emitting unit 200 respectively.

The first conductive elements 302a may be disposed between the light-emitting unit 200 and the driving substrate 100. Specifically, the first conductive elements 302a may be disposed between the first electrode 208 and the second insulating layer 110 or the second electrode 210 and the second insulating layer 110. The first conductive elements 302a may be disposed between the first electrode 208 and the contact pads on the second insulating layer 110 or the second electrode 210 and the contact pads on the second insulating layer 110. In addition, the first conductive elements 302a may electrically connect the first electrode 208 or the second electrode 210 with the driving circuit 104. On the other hand, the second conductive elements 302b may be disposed in the region out of the light-emitting unit 200. The second conductive elements 302b may be dispersed in the first protective layer 300. The second conductive elements 302b also may be disposed at the bottom of the first protective layer 300.

The conductive elements 302 may be formed of conductive materials to serve as an electrical contact of the light-emitting unit 200. The conductive elements 302 may also serve as reflective particles to reflect the light emitted by light-emitting unit 200. In some embodiments of the present disclosure, the conductive elements 302 may be formed of high reflective conductive materials. In some embodiments, the material of the conductive element 302 may include, but is not limited to, gold, platinum, silver, copper, iron, nickel, tin, aluminum, magnesium, palladium, iridium, rhodium, ruthenium, zinc, gold alloys, platinum alloys, silver alloys, copper alloys, iron alloys, nickel alloys, tin alloys, aluminum alloys, magnesium alloys, palladium alloys, iridium alloys, rhodium alloys, ruthenium alloys, zinc alloys, any other suitable conductive materials, or a combination thereof. In addition, further details regarding the conductive elements 302 will be discussed later.

As shown in FIG. 1A, the second semiconductor layer 206 of the light-emitting unit 200 includes a top surface 206a. The first protective layer 300 includes a top surface 300a. In some embodiments of the present disclosure, the elevation E1 of the top surface 206a of the second semiconductor layer 206 is higher than the elevation E2 of the top surface 300a of the first protective layer 300. It should be noted that the term "elevation" used herein refers to the distance from the substrate 102 to a target surface. Specifically, the term "elevation" may refer to the distance from the bottom surface the substrate 102 to a target surface. For example, the elevation E1 of the top surface 206a is defined as the distance from the substrate 102 to the top surface 206a.

As described above, the elevation E1 of the top surface 206a of the second semiconductor layer 206 is higher than the elevation E2 of the top surface 300a of the first protective layer 300. In this way, less material is required to form the protective layer 300 so that the material may be saved, compared with conventional display devices where the elevation of the protective layer is substantially level with that of the upper semiconductor layer (e.g., the second semiconductor layer 206). In addition, there will be more space for the wavelength conversion layer 304 to fill in so that the optical performance of the display device may be improved. In some embodiments of the present disclosure, the difference between the elevation E1 of the second semiconductor layer 206 and the elevation E2 of the first protective layer 300 ranges from about 0.02 μm to about 5 μm, or from about 0.2 μm to about 2 It should be noted that the difference between the elevation E1 and the elevation E2 should not be too small, or the space where the additional portions 304' may be filled will be reduced and thus the illumination efficiency will be decreased and the benefit of material saving may not be achieved; and the difference between the elevation E1 and the elevation E2 should not be too great, or the protecting efficiency of the first protective layer 300 will be reduced and the light-emitting unit 200 may become easily affected by the environment.

Moreover, as shown in FIG. 1A, the quantum well layer 204 of the light-emitting unit 200 includes a top surface 204a. In some embodiments of the present disclosure, the elevation E2 of the top surface 300a of the first protective layer 300 is higher than the elevation E3 of the top surface 204a of the quantum well layer 204. In other words, the quantum well layer 204 is embedded in the first protective layer 300. In this way, quantum well layer 204 of the light-emitting unit 200 may be fully protected by the first protective layer 300 so as to prevent moisture and oxygen from affecting or damaging the quantum well layer 204. In some embodiments of the present disclosure, the difference between the elevation E2 of the first protective layer 300 and the elevation E3 of the quantum well layer 204 ranges from about 0.1 μm to about 10 or from about 1 μm to about 5 It should be noted that the difference between the elevation E2 and the elevation E3 should not be too small, or the protecting efficiency of the first protective layer 300 will be reduced and the light-emitting unit 200 may become easily affected by the environment; and the difference between the elevation E2 and the elevation E3 should not be too great, or the heat capacity of the light-emitting unit 200 will be too great so that heat may be trapped in the first protective layer 300 and may result in damages to the light-emitting unit 200 or the wavelength conversion layer 304 formed thereon. In addition, if the difference between the elevation E2 and the elevation E3 is too great, the benefit of material saving also may not be achieved.

In addition, it should be understood that, although the display device 10 include the wavelength conversion layer 304 disposed on the light-emitting unit 200 in the embodiments illustrated in FIG. 1A, the wavelength conversion layer 304 may be simply replaced with a transparent material without the function of wavelength conversion (e.g., without phosphor particles or quantum dot materials). For example, the transparent material may include, but is not limited to, a polymer or glass matrix.

In some embodiments of the present disclosure, the top surface 300a of the first protective layer 300 may be disposed at any suitable position between the top surface 204a of the quantum well layer 204 and the top surface 206a of the second semiconductor layer 206 as long as the quantum well layer 204 is covered by the first protective layer 300.

Next, still referring to FIG. 1A, the display device 10 may further include the wavelength conversion layer 304 disposed on the light-emitting unit 200 and the first protective layer 300, and a light shielding layer 306 disposed on the first protective layer 300. The wavelength conversion layer 304 may be disposed between the light shielding layers 306 and cover the light-emitting unit 200. The light shielding layer 306 may define a subpixel region in the display device 10. Each subpixel may correspond to a light emitting unit 200. In some embodiments, each subpixel may correspond to more than one light emitting units 200.

In some embodiments of the present disclosure, the wavelength conversion layer 304 includes a portion 304' that covers a portion of the sidewall 206s of the second semiconductor layer 206. As described above, the additional portions 304' of the wavelength conversion layer 304 may further improve the optical performance of the display device, as compared with the conventional display devices where the top surface of the protective layer is substantially level with that of the upper semiconductor layer (i.e., without the additional wavelength conversion portions).

The wavelength conversion layer 304 may include phosphors for converting the wavelength of light generated from the light emitting unit 200. In some embodiments of the present disclosure, the wavelength conversion layer 304 may include a polymer or glass matrix and a dispersion of phosphor particles within the matrix. The light emission from the light emitting unit 200 may be tuned to specific colors in the color spectrum. For example, the wavelength conversion layer 304 includes the phosphors for converting the light emitted from the light emitting unit 200 into red light, green light, blue light or the light of any other suitable color. In some embodiments, the wavelength conversion layer 304 includes quantum dot materials. The quantum dot material may have a core-shell structure. The core may include, but is not limited to, CdSe, CdTe, CdS, ZnS, ZnSe, ZnO, ZnTe, InAs, InP, GaP, or any other suitable materials, or a combination thereof. The shell may include, but is not limited to, ZnS, ZnSe, GaN, GaP, or any other suitable materials, or a combination thereof. In addition, it should be understood that although the wavelength conversion layer 304 as illustrated in FIG. 1A appears to have a convex top surface, the wavelength conversion layer 304 may have any other suitable shapes according to needs. Similarly, the configuration of the light-shielding layer 306 is not limited to that as illustrated in FIG. 1A. The light-shielding layer 306 may also have any other suitable configurations according to needs.

The light-shielding layer 306 disposed adjacent to the wavelength conversion layer 304 may enhance the contrast of luminance. In some embodiments of the present disclosure, the light shielding layer 306 is formed of an opaque material such as a black matrix material. The black matrix material may include, but is not limited to, organic resins, glass pastes, and resins or pastes including black pigments, metallic particles such as nickel, aluminum, molybdenum, and alloys thereof, metal oxide particles (e.g. chromium oxide), or metal nitride particles (e.g. chromium nitride), or any other suitable materials.

In some embodiments of the present disclosure, the wavelength conversion layer 304 and the light shielding layer 306 may be formed by using chemical vapor deposition (CVD), spin-on coating or printing. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method.

As shown in FIG. 1A, the display device 10 may further include a second protective layer 308 covering the wavelength conversion layer 304 and the light shielding layer 306. The second protective layer 308 may prevent the wavelength conversion layer 304 and the light shielding layer 306 from being affected by the outer environment. The second protective layer 308 may be formed of organic materials or inorganic materials. In some embodiments, the inorganic material may include, but is not limited to, silicon nitride, silicon oxide, silicon oxynitride, aluminum oxide, any other suitable protective materials, or a combination thereof. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS), any other suitable protective materials, or a combination thereof.

In some embodiments of the present disclosure, the second protective layer 308 may be formed by using chemical vapor deposition (CVD), spin-on coating or printing. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method.

In addition, the display device 10 may further include an adhesive layer 310 and a cover substrate 312. The adhesive layer 310 may be disposed between the second protective layer 308 and the cover substrate 312 to affix the cover substrate 312 to the second protective layer 308. The adhesive layer 310 may be formed of any suitable adhesive material. On the other hand, the material of the cover substrate 312 may include, but is not limited to, glass, quartz, sapphire, polycarbonate (PC), polyimide (PI), polyethylene terephthalate (PET), any other suitable substrate material, or a combination thereof.

Figure 1B:
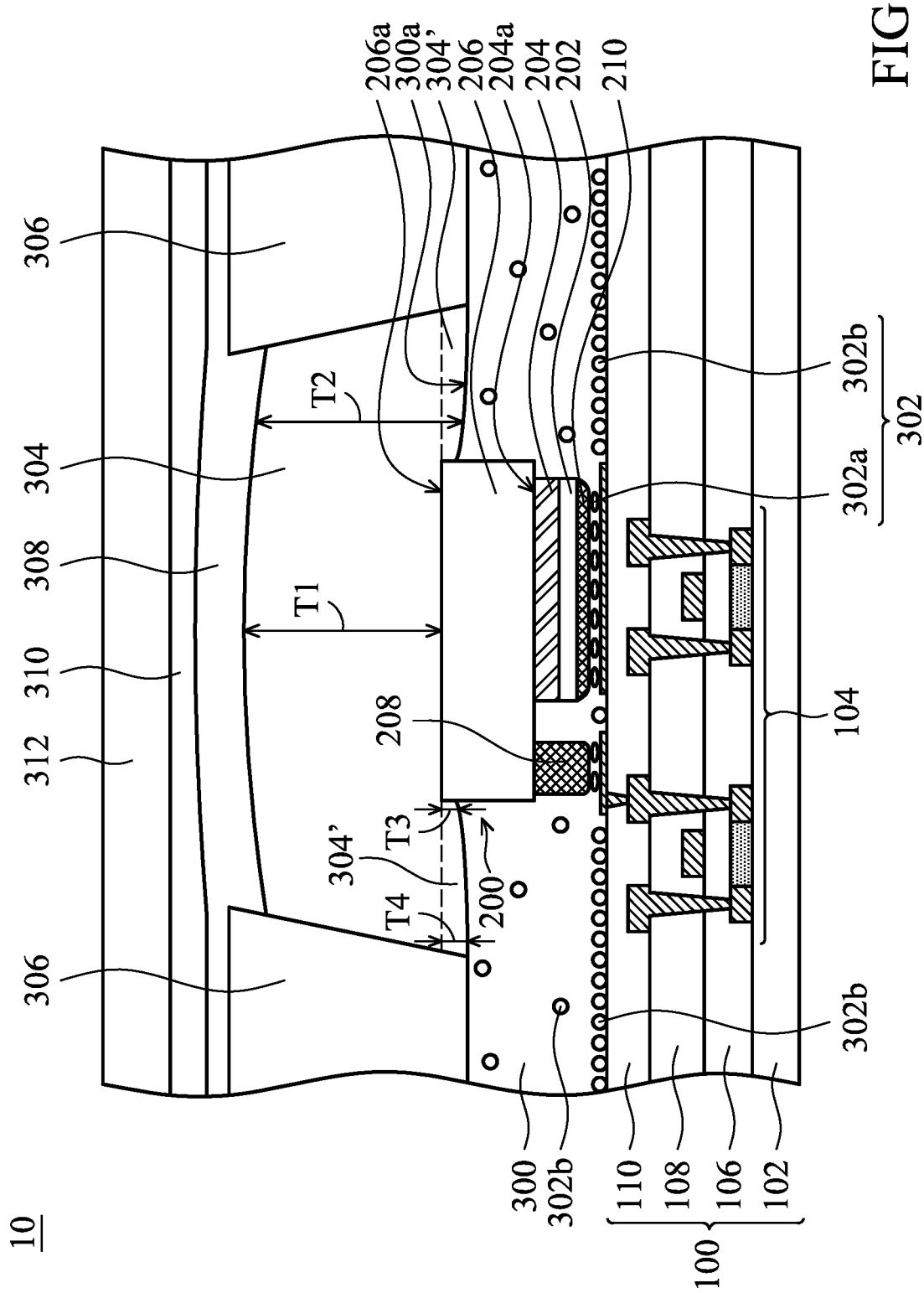

Next, FIG. 1B illustrates a cross-sectional view of the display device 10 in accordance with other embodiments of the present disclosure. It should be noted that the same or similar elements or layers in above and below contexts are represented by the same or similar reference numerals. The materials, manufacturing methods and functions of these elements or layers are the same or similar to those described above, and thus will not be repeated herein. The difference between the embodiments shown in FIG. 1B and FIG. 1A is that the top surface 300a of the first protective layer 300 in the embodiment shown in FIG. 1B has a concave shape while the top surface 300a of the first protective layer 300 in the embodiment shown in FIG. 1A is substantially planar.

As shown in FIG. 1B, the wavelength conversion layer 304 located above the light-emitting unit 200 has a first thickness T1, and the wavelength conversion layer 304 including the additional portions 304' located above the protective layer 300 has a second thickness T2. In some embodiments of the present disclosure, the first thickness T1 may be defined as the maximum thickness of the wavelength conversion layer 304 that is located above the light-emitting unit 200. In some embodiments of the present disclosure, the second thickness T2 may be defined as the maximum thickness of the wavelength conversion layer 304 that is located above the protective layer 300. In this embodiment, the difference between the first thickness T1 and the second thickness T2 in one subpixel may be smaller due to the concave shape of the top surface 300a, as compared with that of the substantially planar top surface 300a (as shown in FIG. 1A). In addition, in some embodiments of the present disclosure, the third thickness T3 of the additional portions 304' that is closer to the light-emitting unit 200 may be smaller than the fourth thickness T4 of the additional portions 304' that is farther from the light-emitting unit 200 due to the concave shape of the top surface 300a.

In some embodiments of the present disclosure, the concave shape of the top surface 300a may be formed due to the hydrophobic properties of the chosen materials of the first protective layer 300. In some embodiments of the present disclosure, the concave shape of the top surface 300a may be formed by a patterning process. The patterning process may include a photolithography process and an etching process such as a selective etching process. The photolithography process may include, but is not limited to, photoresist coating (e.g., spin-on coating), soft baking, hard baking, mask aligning, exposure, post-exposure baking, developing the photoresist, rinsing, drying, and other suitable processes. The etching process may include dry etching process or wet etching process.

Figure 1C:
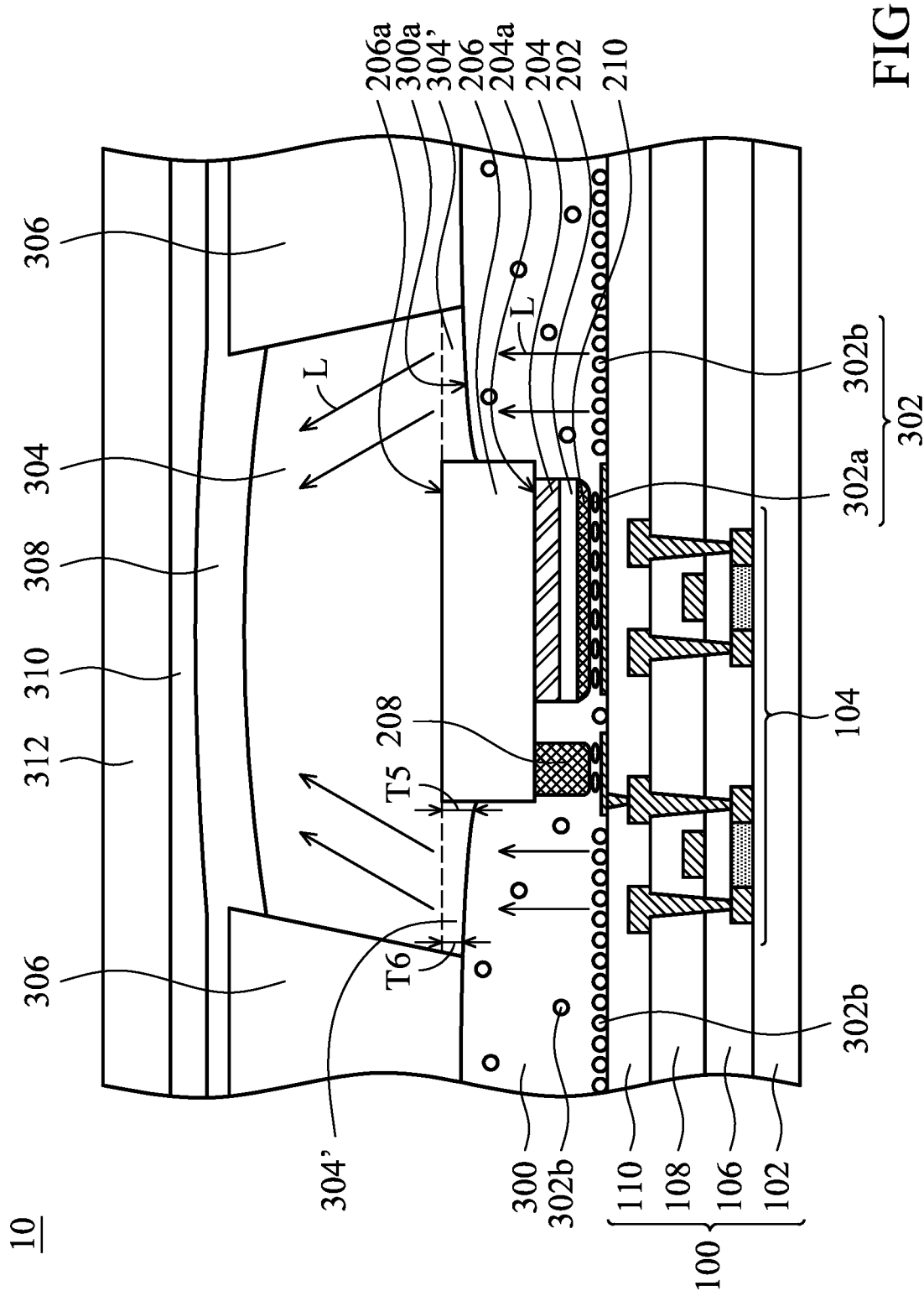

Next, FIG. 1C illustrates a cross-sectional view of the display device 10 in accordance with other embodiments of the present disclosure. The difference between the embodiments shown in FIG. 1C and FIG. 1A is that the top surface 300a of the first protective layer 300 in the embodiment shown in FIG. 1C has a convex shape while the top surface 300a of the first protective layer 300 in the embodiment shown in FIG. 1A is substantially planar.

As shown in FIG. 1C, in this embodiment, the fifth thickness T5 of the additional portions 304' that is closer to the light-emitting unit 200 may be greater than the sixth thickness T6 of the additional portions 304' that is farther from the light-emitting unit 200 due to the convex shape of the top surface 300a. In addition, the reflected light L may be concentrated to increase the illumination efficiency due to the convex surface of the top surface 300a.

In some embodiments of the present disclosure, the convex shape of the top surface 300a may be formed due to the hydrophilic properties of the chosen materials of the first protective layer 300. In some embodiments of the present disclosure, the convex shape of the top surface 300a may be formed by a patterning process. The patterning process may include a photolithography process and an etching process such as a selective etching process. The photolithography process may include, but is not limited to, photoresist coating (e.g., spin-on coating), soft baking, hard baking, mask aligning, exposure, post-exposure baking, developing the photoresist, rinsing, drying, and other suitable processes. The etching process may include dry etching process or wet etching process.

Figure 2A:
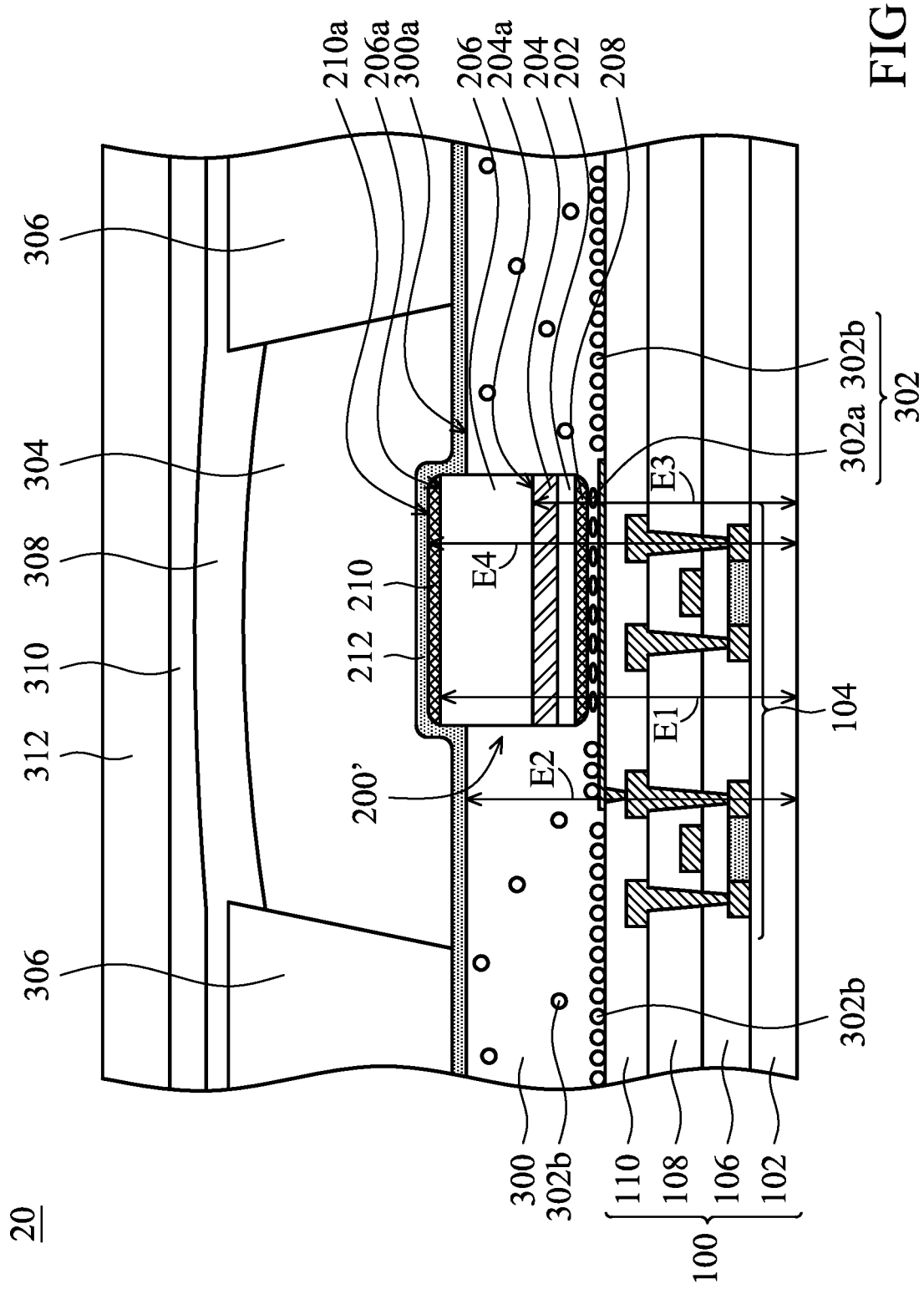
FIGS. 2A-2C illustrate the cross-sectional views of the display device in accordance with some embodiments of the present disclosure.

Next, FIG. 2A illustrates a cross-sectional view of the display device 20 in accordance with some embodiments of the present disclosure. The difference between the embodiments shown in FIG. 2A and FIG. 1A is that the light-emitting unit 200' in the embodiment shown in FIG. 2A is a vertical chip type light-emitting diode while the light-emitting unit 200 in the embodiment shown in FIG. 1A is a flip chip type light-emitting diode.

As shown in FIG. 2A, the light-emitting unit 200' may be disposed on the driving circuit 104 and electrically connected to the driving circuit 104. The first electrode 208 of the light-emitting unit 200' is disposed on the conductive elements 302 and may serve as a bottom electrode of the light-emitting unit 200'. The first semiconductor layer 202, the quantum well layer 204 and the second semiconductor layer 206 are sequentially stacked on the first electrode 208. The second electrode 210 is disposed on the second semiconductor layer 206 and may serve as a top electrode of the light-emitting unit 200. In addition, in this embodiment, the light-emitting unit 200' may further include a contact layer 212 disposed on the second electrode 210 and the first protective layer 300. The contact layer 212 may serve as an electrical contact of the light-emitting unit 200'. In some embodiments of the present disclosure, the contact layer 212 may be conformally formed over the second electrode 210 and the first protective layer 300. The contact layer 212 may couple to the circuit from different array or to the circuit outside the panel.

In some embodiments of the present disclosure, the material of the contact layer 212 may include transparent conductive oxides (TCO). For example, the transparent conductive material may include, but is not limited to, indium tin oxide (ITO), tin oxide (SnO), zinc oxide (ZnO), indium zinc oxide (IZO), indium gallium zinc oxide (IGZO), indium tin oxide (ITZO), antimony tin oxide (ATO), antimony zinc oxide (AZO), any other suitable transparent conductive materials, or a combination thereof.

In addition, the contact layer 212 may be formed by using chemical vapor deposition (CVD) or spin-on coating. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method.

Similar to the display device 10 in FIG. 1A, the display device 20 of the embodiment as shown in FIG. 2A, the elevation E1 of the top surface 206a of the second semiconductor layer 206 is higher than the elevation E2 of the top surface 300a of the first protective layer 300. In some embodiments of the present disclosure, the difference between the elevation E1 of the second semiconductor layer 206 and the elevation E2 of the first protective layer 300 ranges from about 0.02 μm to about 5 μm, or from about 0.2 μm to about 2 In addition, the elevation E2 of the top surface 300a of the first protective layer 300 is higher than the elevation E3 of the top surface 204a of the quantum well layer 204. In some embodiments of the present disclosure, the difference between the elevation E2 of the first protective layer 300 and the elevation E3 of the quantum well layer 204 ranges from about 0.1 μm to about 10 μm, or from about 1 μm to about 5 μm.

Furthermore, in the display device 20 of the embodiment as shown in FIG. 2A, the second electrode 210 of the light-emitting unit 200' includes a top surface 210a. The elevation E4 of the top surface 210a of the second electrode 210 is also higher than the elevation E2 of the top surface 300a of the first protective layer 300. In some embodiments of the present disclosure, the difference between the elevation E4 of the second electrode 210 and the elevation E2 of the first protective layer 300 ranges from about 0.02 µm to about 5 µm, or from about 0.2 µm to about 2 µm.

Figure 2B:
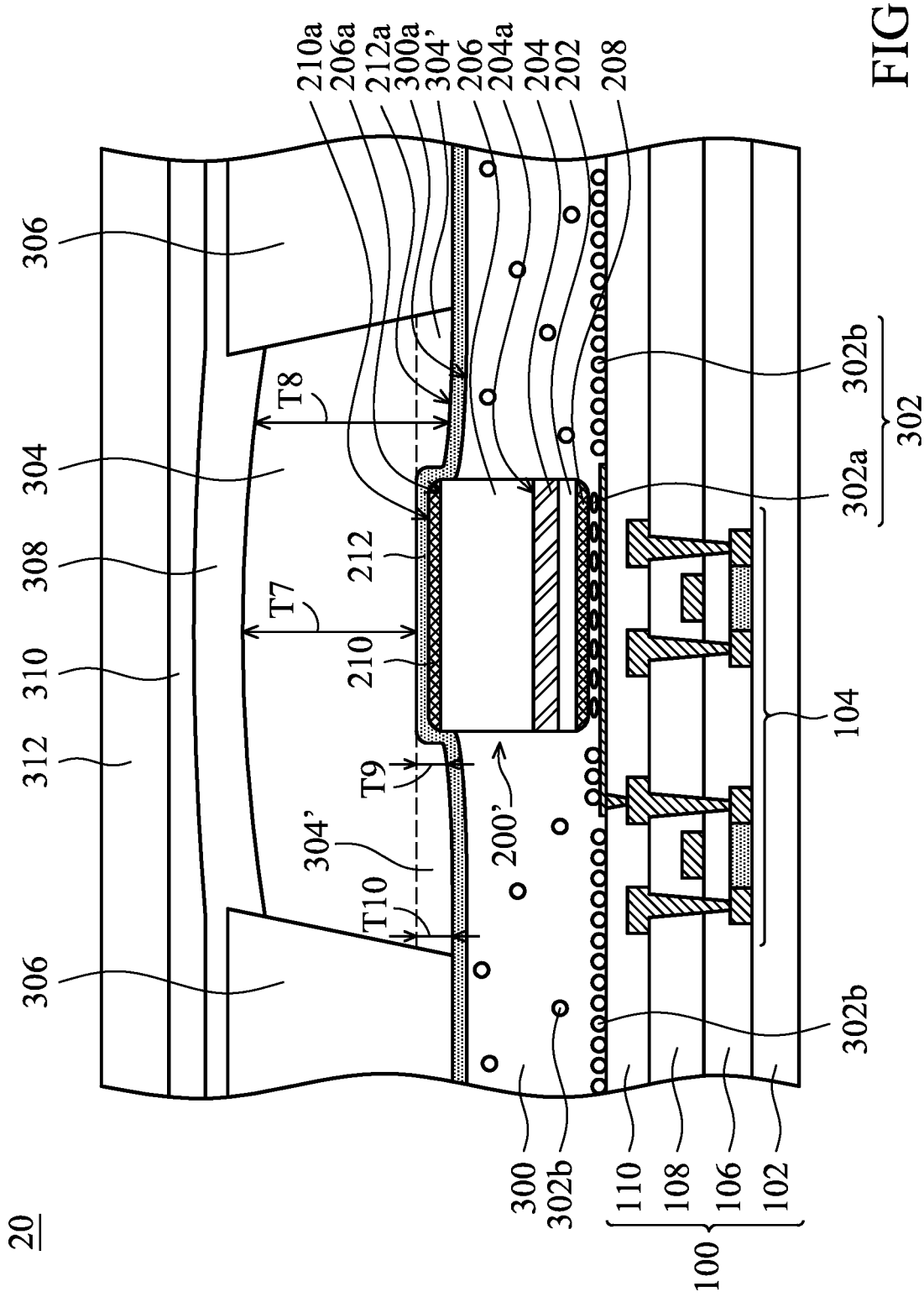

Next, FIG. 2B illustrates a cross-sectional view of the display device 20 in accordance with other embodiments of the present disclosure. The difference between the embodiments shown in FIG. 2B and FIG. 2A is that the top surface 300a of the first protective layer 300 in the embodiment shown in FIG. 2B has a concave shape while the top surface 300a of the first protective layer 300 in the embodiment shown in FIG. 2A is substantially planar. Moreover, the top surface 212a of the contact layer 212 may also has a concave shape.

As shown in FIG. 2B, the wavelength conversion layer 304 located above the light-emitting unit 200' has a seventh thickness T7, and the wavelength conversion layer 304 including the additional portions 304' located above the protective layer 300 has an eighth thickness T8. In some embodiments of the present disclosure, the seventh thickness T7 may be defined as the maximum thickness of the wavelength conversion layer 304 that is located above both the light-emitting unit 200' and the contact layer 212. In some embodiments of the present disclosure, the eighth thickness T8 may be defined as the maximum thickness of the wavelength conversion layer 304 that is located both above the protective layer 300 and the contact layer 212. In this embodiment, the difference between the seventh thickness T7 and the eighth thickness T8 in one subpixel may be smaller due to the concave shape of the top surface 300a and the top surface 212a, as compared with that of the substantially planar top surface 300a and the top surface 212a (as shown in FIG. 2A). In addition, in some embodiments of the present disclosure, the ninth thickness T9 of the additional portions 304' that is closer to the light-emitting unit 200' may be smaller than the tenth thickness T10 of the additional portions 304' that is farther from the light-emitting unit 200' due to the concave shape of the top surface 300a and the top surface 212a.

Figure 2C:
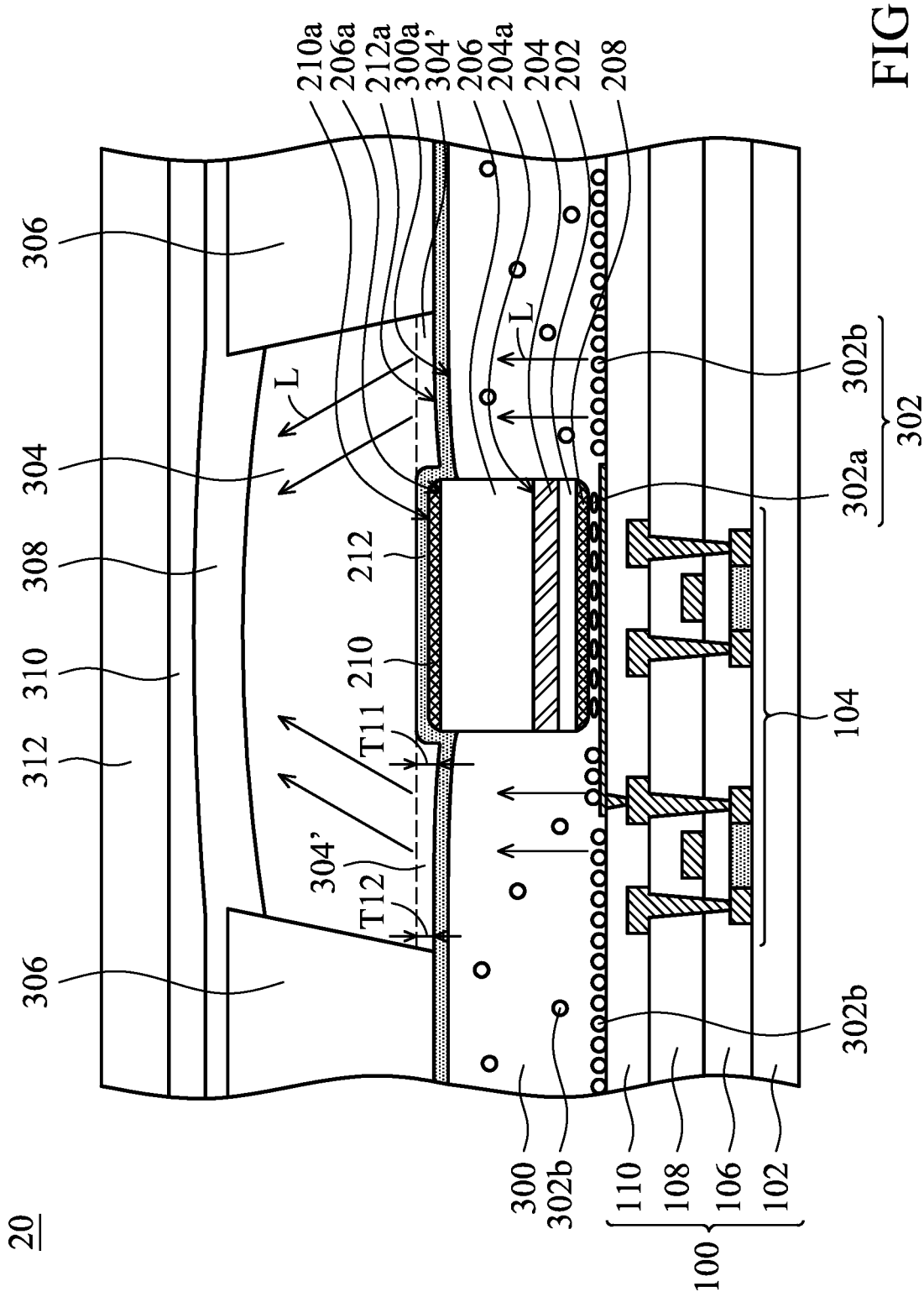

Next, FIG. 2C illustrates a cross-sectional view of the display device 20 in accordance with other embodiments of the present disclosure. The difference between the embodiments shown in FIG. 2C and FIG. 2A is that the top surface 300a of the first protective layer 300 in the embodiment shown in FIG. 2C has a convex shape while the top surface 300a of the first protective layer 300 in the embodiment shown in FIG. 2A is substantially planar. Moreover, the top surface 212a of the contact layer 212 may also has a convex shape.

As shown in FIG. 2C, in this embodiment, the eleventh thickness T11 of the additional portions 304' that is closer to the light-emitting unit 200' may be greater than the twelfth thickness T12 of the additional portions 304' that is farther from the light-emitting unit 200' due to the convex shape of the top surface 300a and the top surface 212a. In addition, the reflected light L may be concentrated to increase the illumination efficiency due to the convex surface of the top surface 300a and the top surface 212a.

Figure 3A:
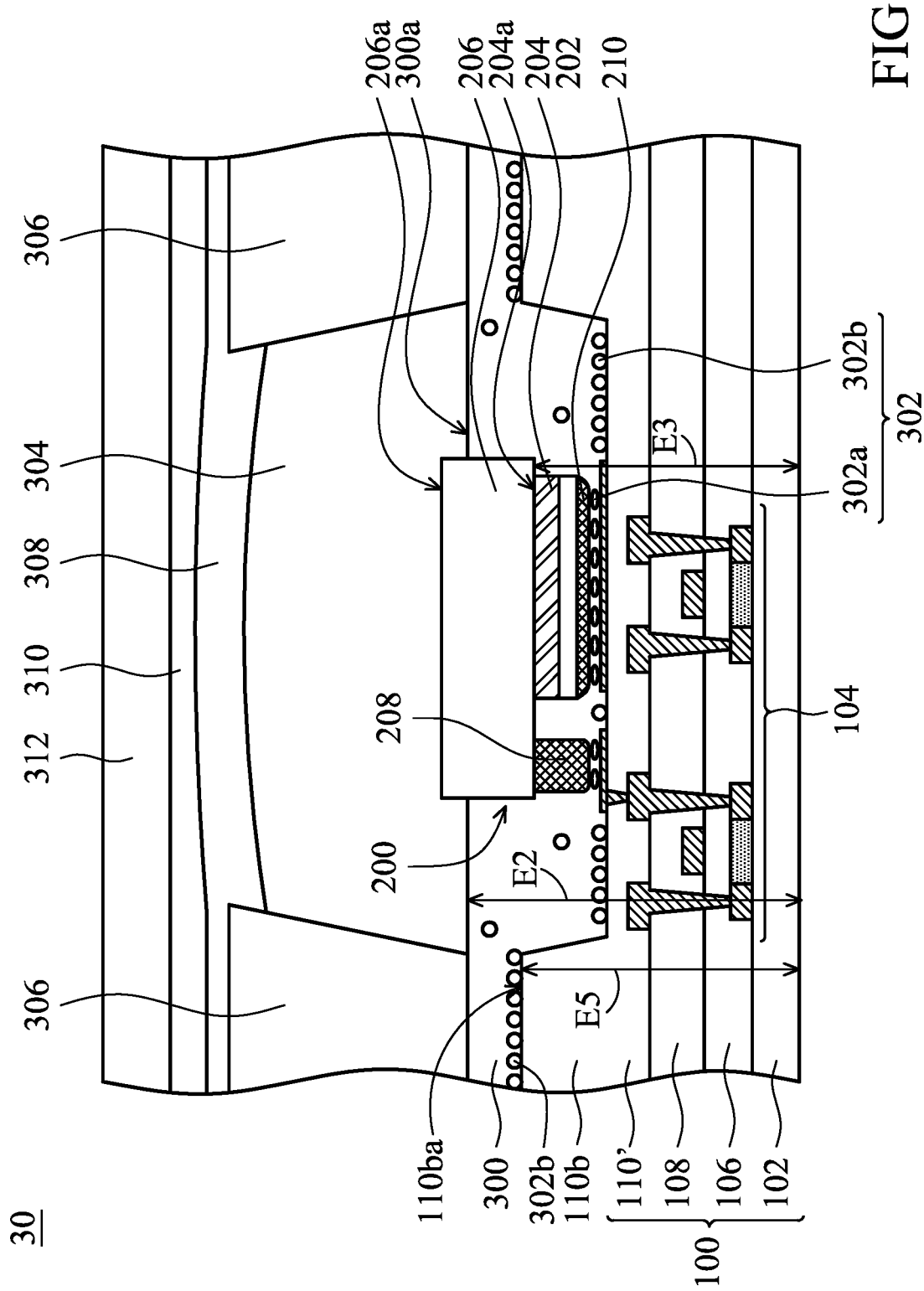
FIGS. 3A-3B illustrate the cross-sectional views of the display device in accordance with some embodiments of the present disclosure.

Next, FIG. 3A illustrates a cross-sectional view of the display device 30 in accordance with some embodiments of the present disclosure. The difference between the embodiments shown in FIG. 3A and FIG. 1A is that the second insulating layer 110' in the embodiment shown in FIG. 3A further includes a bank portion 110b.

As shown in FIG. 3A, the bank portion 110b of the second insulating layer 110' protrudes toward the light shielding layer 306. The bank portion 110b of the second insulating layer 110' includes a top surface 110ba. In some embodiments of the present disclosure, the elevation E5 of the top surface 110ba of the second insulating layer 110' is lower than the elevation E2 of the top surface 300a of the first protective layer 300. In such a configuration, the materials of the first protective layer 300 may be conserved since the bank portions 110b of the second insulating layer 110' occupies some of the spaces that are originally to be filled in with the first protective layer 300. On the other hand, the elevation E5 of the top surface 110ba of the second insulating layer 110' may be lower or higher than the elevation E3 of the top surface 204a of the quantum well layer 204.

In some embodiments of the present disclosure, since the second insulating layer 110' includes the bank portions 110b, the light-emitting units 200 may be disposed in the trench or the cavity defined by the bank portions 110b. In some embodiments, a plurality of light-emitting units 200 are disposed in the same trench defined by the bank portions 110b. In other embodiments, each of the light-emitting unit 200 is disposed in a cavity defined by the bank portions 110b separately. In addition, each cavity includes a plurality of light-emitting units 200 disposed therein in accordance with some embodiments.

In addition, the bank portion 110b may be formed by performing a patterning process to the second insulating layer 110'. The patterning process may include a photolithography process and an etching process such as a selective etching process. The photolithography process may include, but is not limited to, photoresist coating (e.g., spin-on coating), soft baking, hard baking, mask aligning, exposure, post-exposure baking, developing the photoresist, rinsing, drying, and other suitable processes. The etching process may include dry etching process or wet etching process.

Figure 3B:
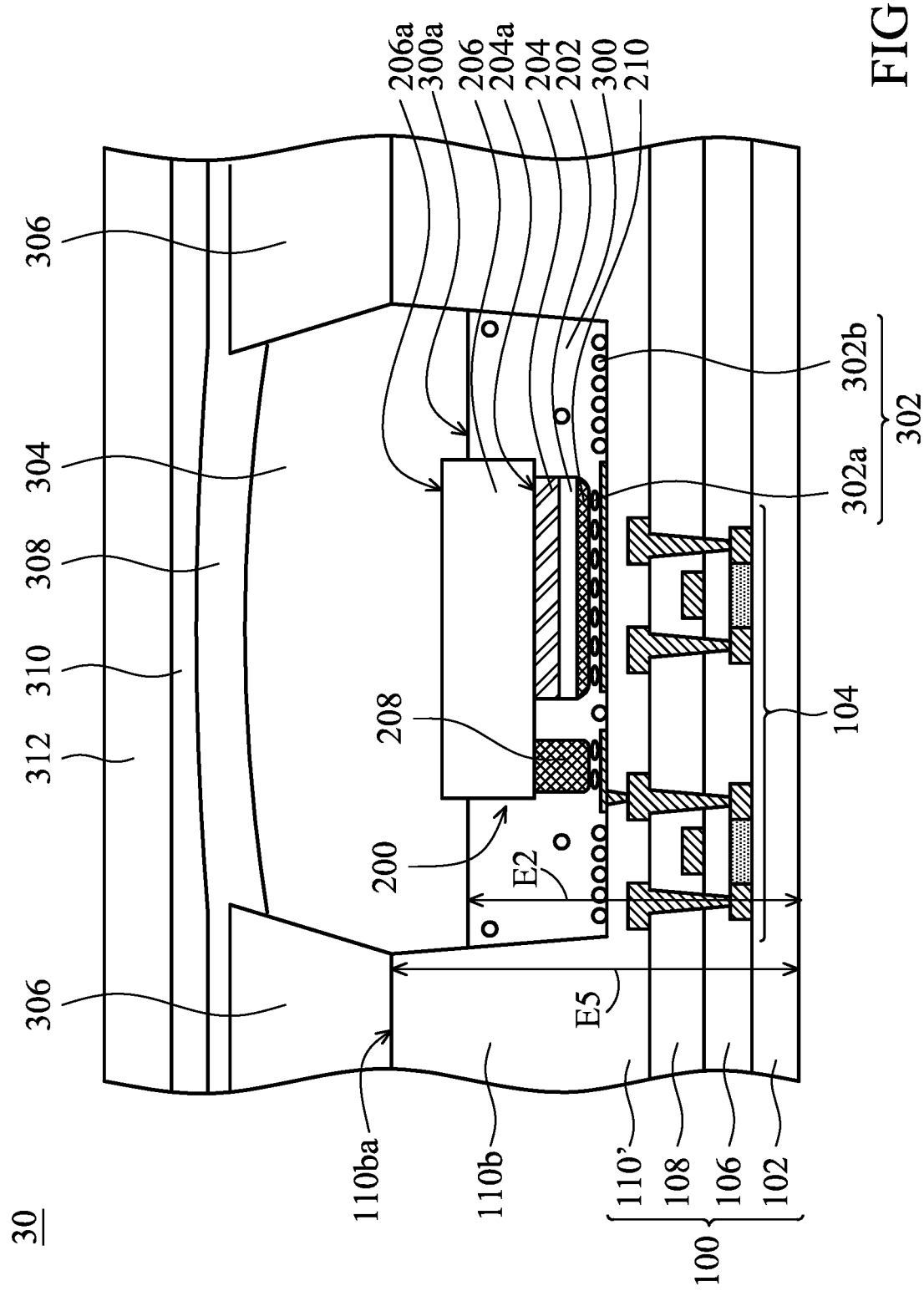

In accordance with some embodiments of the present disclosure, the elevation E5 of the top surface 110ba of the second insulating layer 110' is equal to the elevation E2 of the top surface 300a of the first protective layer 300. In accordance with other embodiments of the present disclosure, the elevation E5 of the top surface 110ba of the second insulating layer 110' is higher than the elevation E2 of the top surface 300a of the first protective layer 300 (as shown in FIG. 3B). In addition, the second insulating layer 110' may be a two-layered structure or multi-layers stack structure in accordance with some embodiments.

Figure 4:
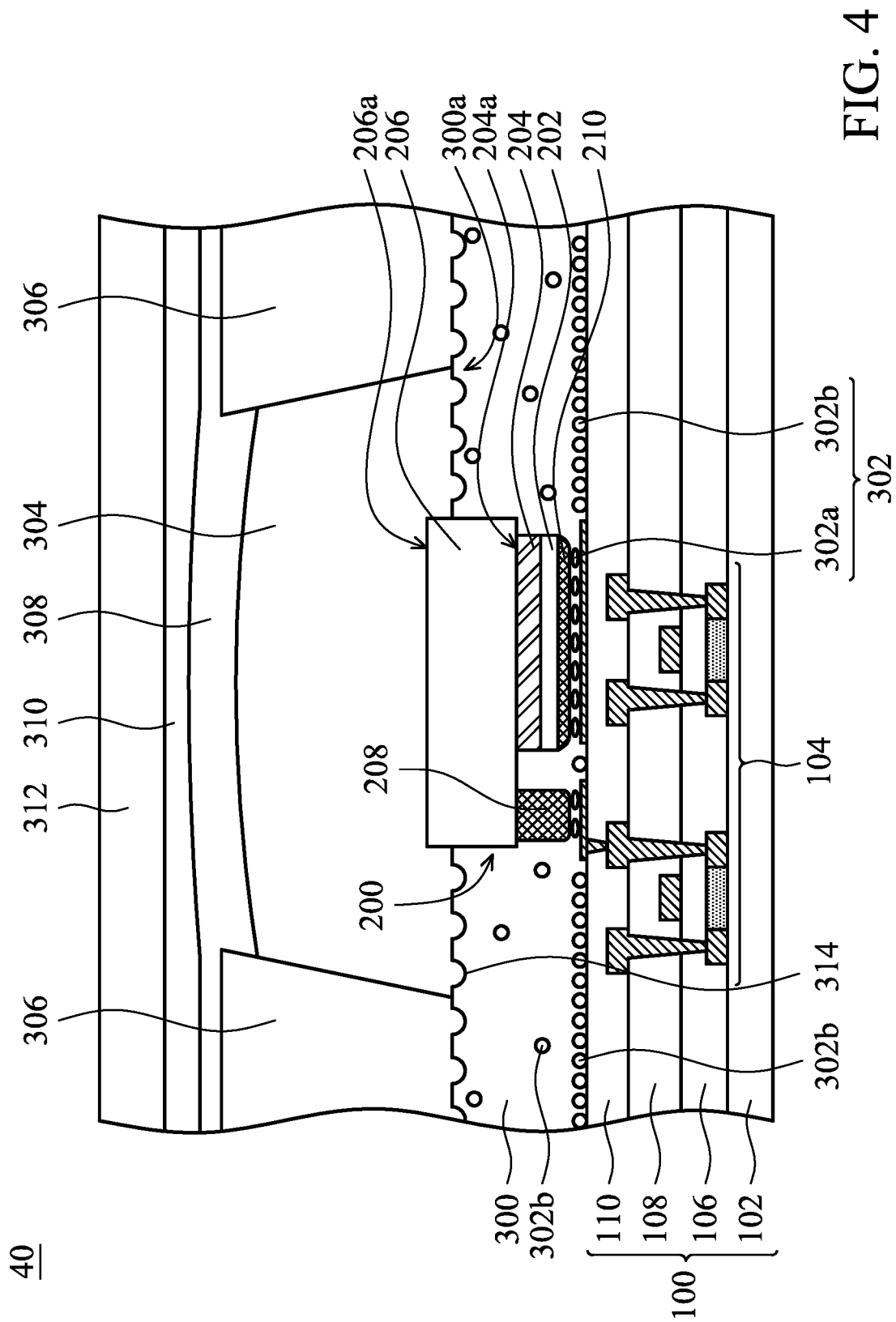
FIG. 4 illustrates the cross-sectional view of the display device in accordance with some embodiments of the present disclosure.

Next, FIG. 4 illustrates a cross-sectional view of the display device 40 in accordance with some embodiments of the present disclosure. The difference between the embodiments shown in FIG. 4 and FIG. 1A is that the top surface 300a of the first protective layer 300 in the embodiment shown in FIG. 4 includes a plurality of recesses 314. In other words, the top surface 300a of the first protective layer 300 has a pothole structure.

In some embodiments of the present disclosure, the recesses 314 of the top surface 300a of the first protective layer 300 may be randomly distributed. In some embodiments of the present disclosure, the size of the recess 314 may range from about 1 nm to about 10 um or from about 100 nm to about 2 um. In addition, in such a configuration, the recesses 314 of the top surface 300a of the first protective layer 300 may prevent the reflected light from being trapped in the first protective layer 300 due to the total reflection. Accordingly, the recesses 314 of the top surface 300a may increase or improve the illumination efficiency of the display device.

In some embodiments of the present disclosure, the recesses 314 of the top surface 300a may be formed by a patterning process. The patterning process may include a photolithography process and an etching process such as a selective etching process. The photolithography process may include, but is not limited to, photoresist coating (e.g., spin-on coating), soft baking, hard baking, mask aligning, exposure, post-exposure baking, developing the photoresist, rinsing, drying, and other suitable processes. The etching process may include dry etching process or wet etching process.

Figure 5A:
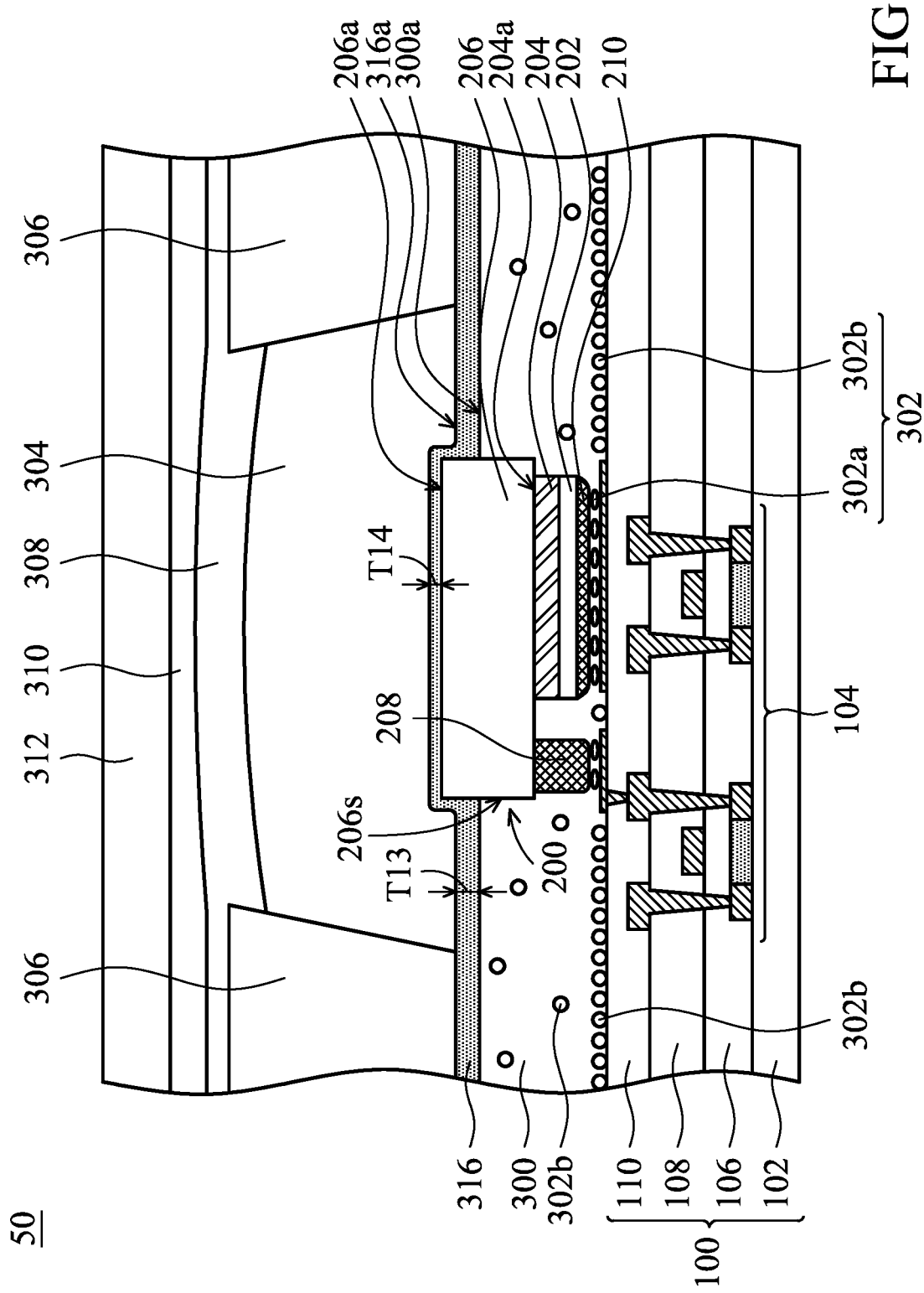
FIGS. 5A-5C illustrate the cross-sectional views of the display device in accordance with some embodiments of the present disclosure.

Next, FIG. 5A illustrates a cross-sectional view of the display device 50 in accordance with some embodiments of the present disclosure. The difference between the embodiments shown in FIG. 5A and FIG. 1A is that the display device 50 further includes a buffer layer 316 disposed on the light-emitting unit 200.

As shown in FIG. 5A, the buffer layer 316 may be disposed on the light-emitting unit 200 and the first protective layer 300. The buffer layer 316 may be disposed between the light-emitting unit 200 and the wavelength conversion layer 304. In some embodiments of the present disclosure, the buffer layer 316 may be conformally formed over the light-emitting unit 200 and the first protective layer 300. In addition, the buffer layer 316 may cover the sidewall 206s of the second semiconductor layer 206. As described above, the buffer layer 316 may be disposed between the light-emitting unit 200 and the wavelength conversion layer 304 so that the direct contact between the light-emitting unit 200 and the wavelength conversion layer 304 may be avoided. Thus, the wavelength conversion layer 304 may be unaffected by the current or heat produced by the light-emitting unit 200. As described above, although the display device 50 include the wavelength conversion layer 304 disposed on the light-emitting unit 200 in the embodiments illustrated in FIG. 5A, the wavelength conversion layer 304 may be simply replaced with a transparent material without the function of wavelength conversion (e.g., without phosphor particles or quantum dot materials). For example, the transparent material may include, but is not limited to, a polymer or glass matrix.

In some embodiments of the present disclosure, the buffer layer 316 may be an insulator. In some embodiments of the present disclosure, the buffer layer 316 may include organic materials and/or inorganic materials. The buffer layer 316 may be formed of organic insulating materials. The organic insulating material may include, but is not limited to, polyamide, polyethylene, polystyrene, polypropylene, polyester, polyimide, polyurethane, silicones, polyacrylate, benzo-cyclo-butene (BCB), polyvinylpyrrolidone (PVP), polyvinylfluoride (PVF), polyvinylidene fluoride (PVDF), polytetrafluoroethylene (PTFE), polymethylmetacrylate (PMMA), polydimethylsiloxane (PDMS), any other suitable organic insulating materials, or a combination thereof. The inorganic insulating material may include, but is not limited to, $SiO_x$, $SiN_x$, $AlO_x$, any other suitable inorganic insulating materials, or a combination thereof.

In addition, the buffer layer 316 may be formed by using chemical vapor deposition (CVD) or spin-on coating. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method.

In some embodiments of the present disclosure, the thickness of the buffer layer 316 may not be uniform. As shown in FIG. 5A, the buffer layer 316 located above the first protective layer 300 may have a thirteenth thickness T13, and the buffer layer 316 located above the light-emitting unit 200 has a fourteenth thickness T14. In some embodiments of the present disclosure, the thirteenth thickness T13 of the buffer layer 316 is greater than the fourteenth thickness T14 of the buffer layer 316. That is, the buffer layer 316 disposed directly on the light-emitting unit 200 may be thinner than the buffer layer 316 directly disposed on the first protective layer 300. In such a configuration, the intensity of the light emitted from the light-emitting unit 200 will not be greatly decreased since the buffer layer 316 disposed on the light-emitting unit 200 is thinner. In some embodiments of the present disclosure, the difference between the thirteenth thickness T13 and the fourteenth thickness T14 may range from about 0.001 um to about 5 um or from about 0.05 um to about 2 um. In some embodiments of the present disclosure, the thirteenth thickness T13 of the buffer layer 316 may range from about 0.02 µm to about 5 µm or from about 0.1 um to about 2 um. In some embodiments of the present disclosure, the fourteenth thickness T14 of the buffer layer 316 may range from about 0.02 µm to about 5 µm or from about 0.1 um to about 2 um.

Figure 5B:
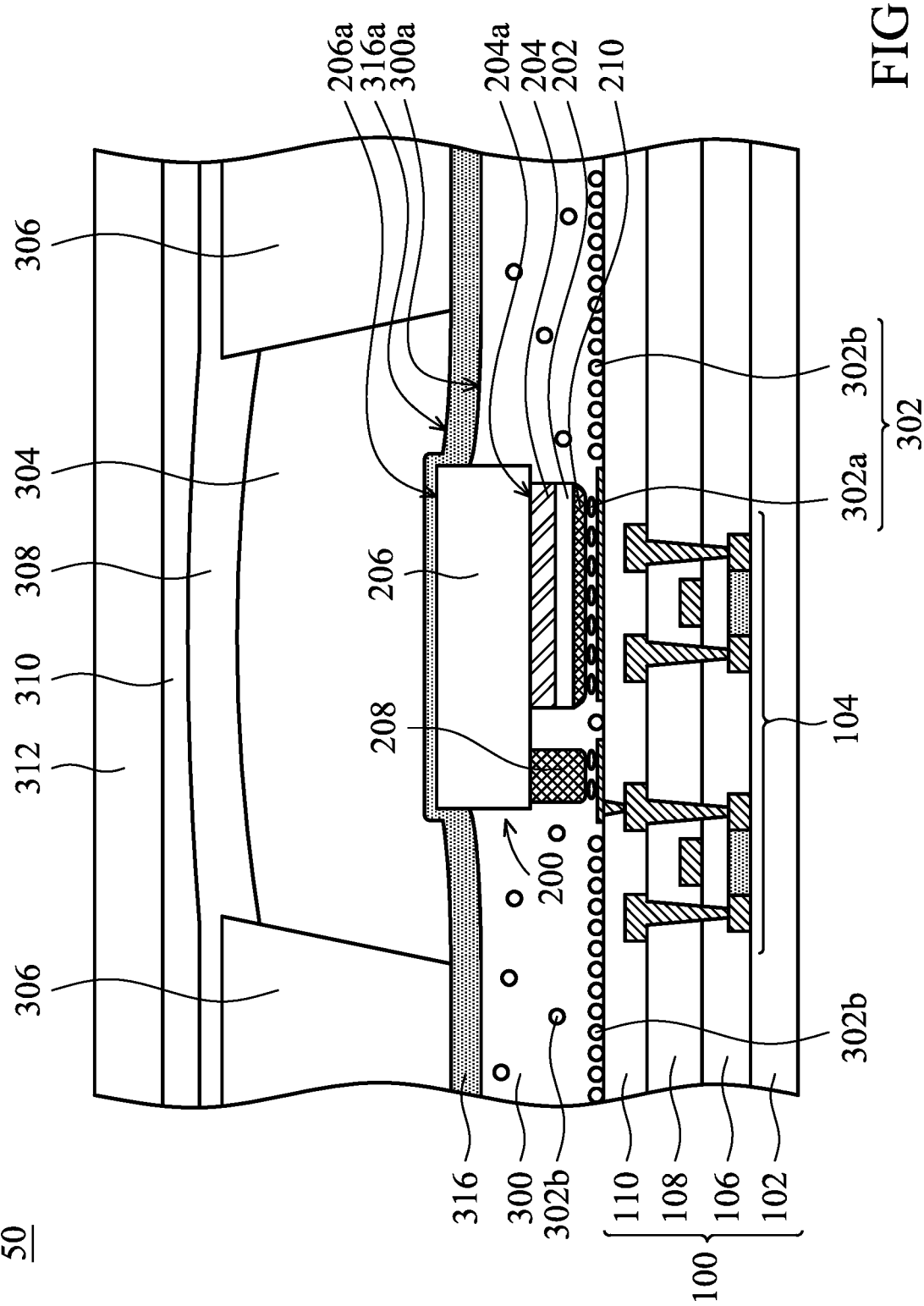

Next, FIG. 5B illustrates a cross-sectional view of the display device 50 in accordance with other embodiments of the present disclosure. The difference between the embodiments shown in FIG. 5B and FIG. 5A is that the top surface 316a of the buffer layer 316 on the first protective layer 300 in the embodiment shown in FIG. 5B has a concave shape while the top surface 316a of the buffer layer 316 on the first protective layer 300 in the embodiment shown in FIG. 5A is substantially planar.

Figure 5C:
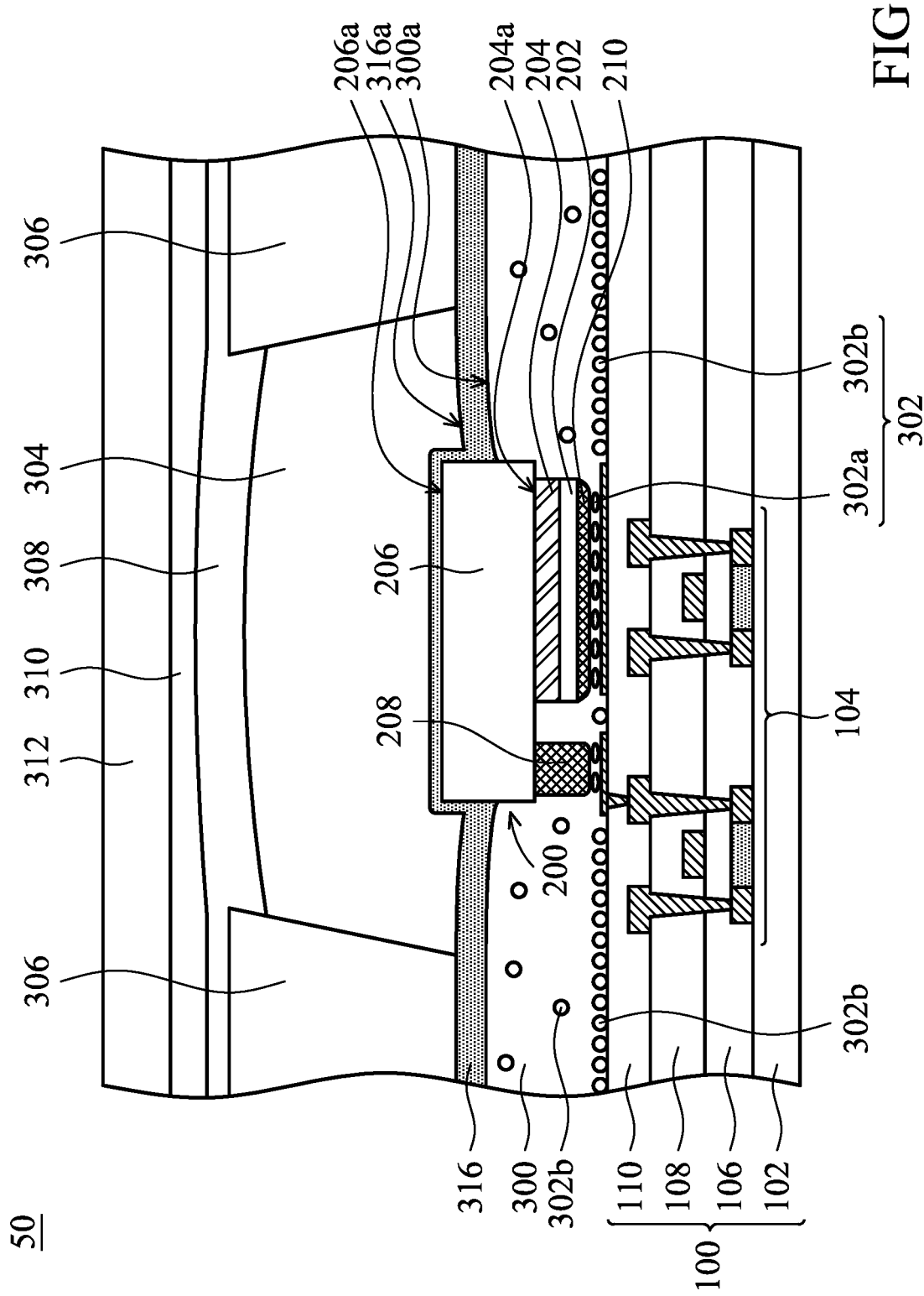

In addition, as shown in FIG. 5C, the top surface 316a of the buffer layer 316 on the first protective layer 300 may have a convex shape in accordance with other embodiments of the present disclosure.

Figure 6A:
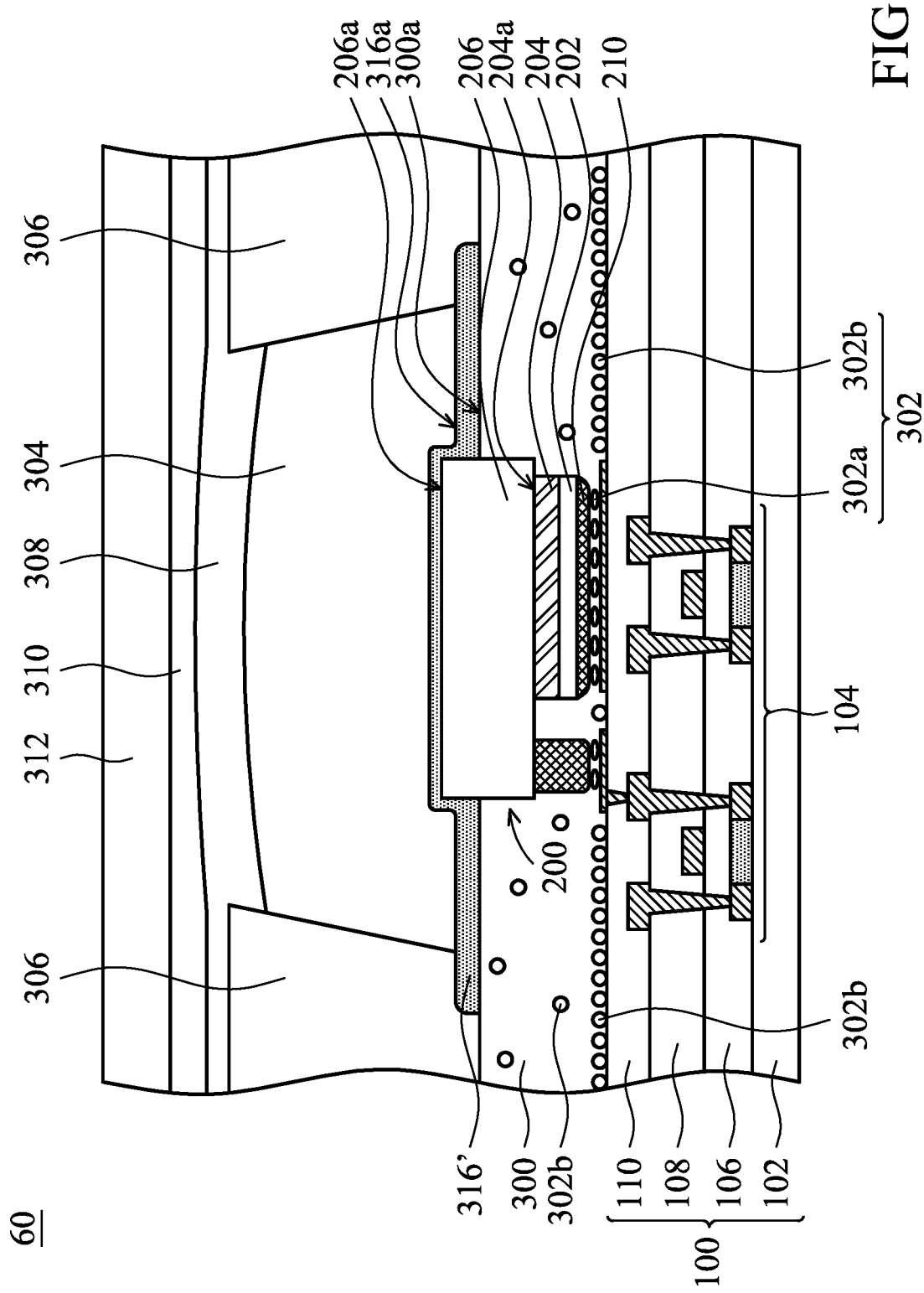
FIGS. 6A-6B illustrate the cross-sectional views of the display device in accordance with some embodiments of the present disclosure.

Next, FIG. 6A illustrates a cross-sectional view of the display device 60 in accordance with other embodiments of the present disclosure. The difference between the embodiments shown in FIG. 6A and FIG. 5A is that the buffer layer 316' in the embodiment shown in FIG. 6A is a discontinuous structure while the buffer layer 316 in the embodiment shown in FIG. 5A is a continuous structure.

As shown in FIG. 6A, the buffer layers 316' within different subpixels may be discontinuous. In other words, the buffer layers 316' from different subpixels may be separated. In this embodiment, a portion of the buffer layers 316' may be disposed over the light-emitting unit 200 while another portion of the buffer layers 316' may be disposed over the first protective layer 300. In particular, the buffer layers 316' may entirely cover the top surface 206a of the second semiconductor layer 206, and partially cover the top surface 300a of the first protective layer 300. In some embodiments of the present disclosure, the buffer layer 316' extends from the light-emitting unit 200 through the wavelength conversion layer 304 and to the light shielding layer 306.

In some embodiments of the present disclosure, the buffer layers 316' may be formed by a patterning process. The patterning process may include a photolithography process and an etching process such as a selective etching process. The photolithography process may include, but is not limited to, photoresist coating (e.g., spin-on coating), soft baking, hard baking, mask aligning, exposure, post-exposure baking, developing the photoresist, rinsing, drying, and other suitable processes. The etching process may include dry etching process or wet etching process.

Figure 6B:
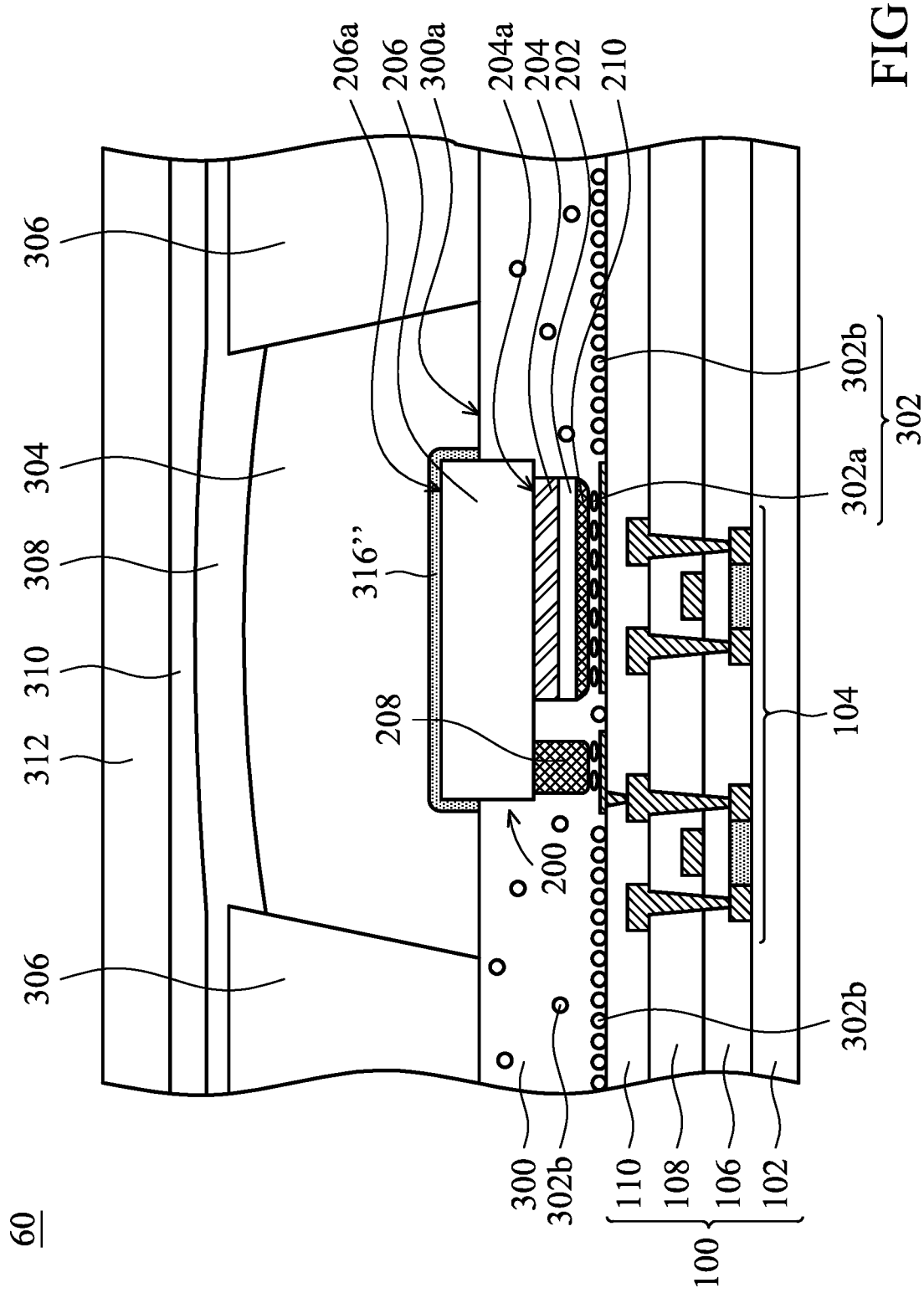

Next, FIG. 6B illustrates a cross-sectional view of the display device 60 in accordance with other embodiments of the present disclosure. The difference between the embodiments shown in FIG. 6B and FIG. 6A is that the buffer layer 316" in the embodiment shown in FIG. 6B does not extend to the light shielding layer 306.

As shown in FIG. 6B, the buffer layer 316" may entirely cover the top surface 206a of the second semiconductor layer 206, and partially cover the sidewall 206s of the second semiconductor layer 206. The buffer layer 316" does not extend along the top surface 300a of the protective layer 300. Similarly, the buffer layers 316" may be formed by the patterning process as described above.

Next, FIG. 7A illustrates a cross-sectional view of the display device 70 in accordance with some embodiments of the present disclosure. The difference between the embodiments shown in FIG. 7A and FIG. 2A is that the display device 70 further includes a buffer layer 316 disposed on the contact layer 212.

Figure 7:
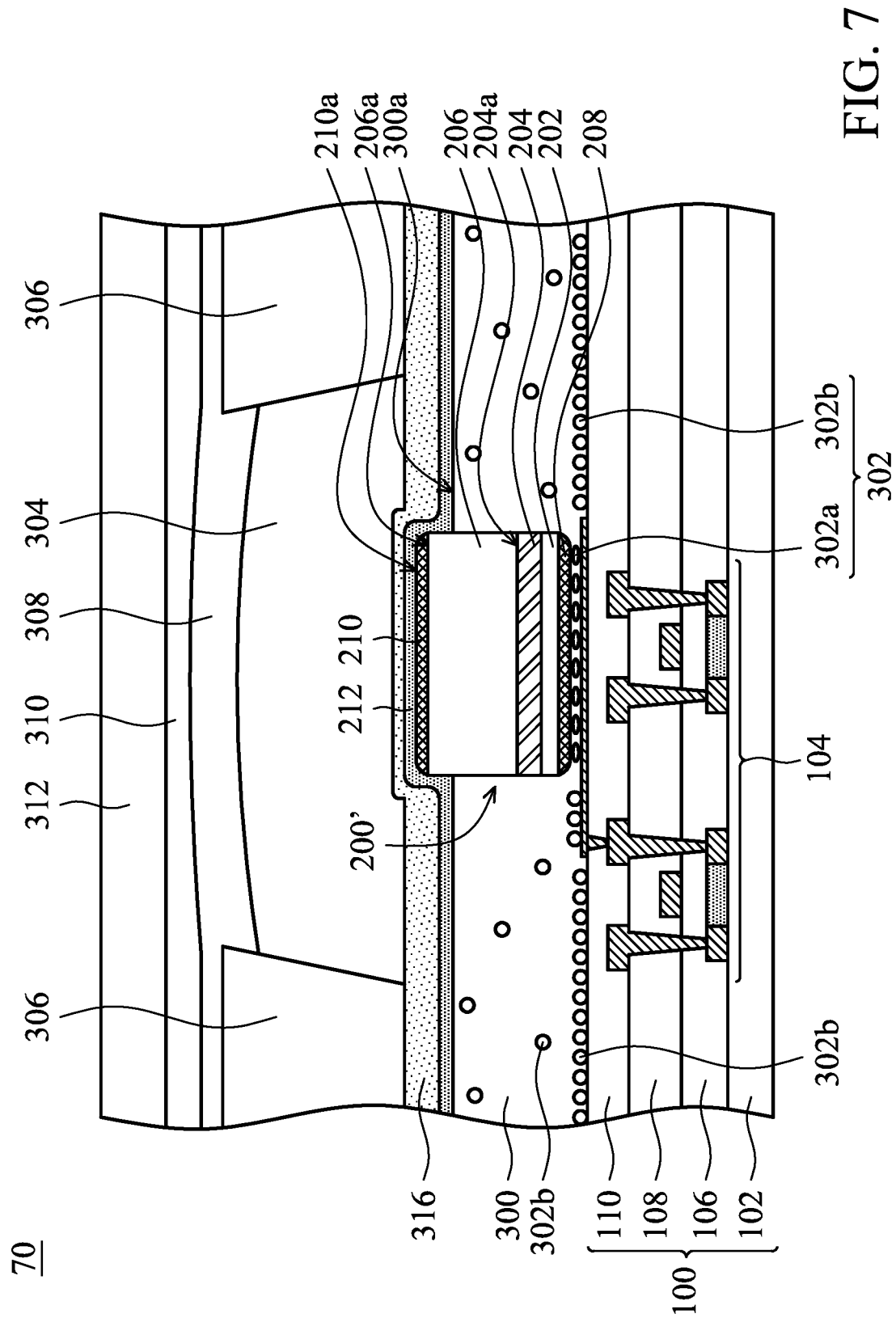
FIG. 7 illustrates the cross-sectional view of the display device in accordance with some embodiments of the present disclosure.

As shown in FIG. 7, the buffer layer 316 may be disposed between the contact layer 212 and the wavelength conversion layer 310. In some embodiments of the present disclosure, the buffer layer 316 may be conformally formed over the contact layer 212. As described above, the buffer layer 316 may be disposed between the contact layer 212 and the wavelength conversion layer 310 so that the direct contact between the contact layer 212 and the wavelength conversion layer 310 may be avoided. Thus, the wavelength conversion layer 310 may be unaffected by the current or heat produced by the light-emitting unit 200 including the contact layer 212.

In some embodiments of the present disclosure, the thickness of the buffer layer 316 may not be uniform. As shown in FIG. 7, the buffer layer 316 disposed directly above the light-emitting unit 200 may be thinner than the buffer layer 316 directly disposed above the first protective layer 300 in accordance with some embodiments of the present disclosure. In such a configuration, the intensity of the light emitted from the light-emitting unit 200 will not be greatly decreased since the buffer layer 316 disposed on the light-emitting unit 200 is thinner.

Figure 8:
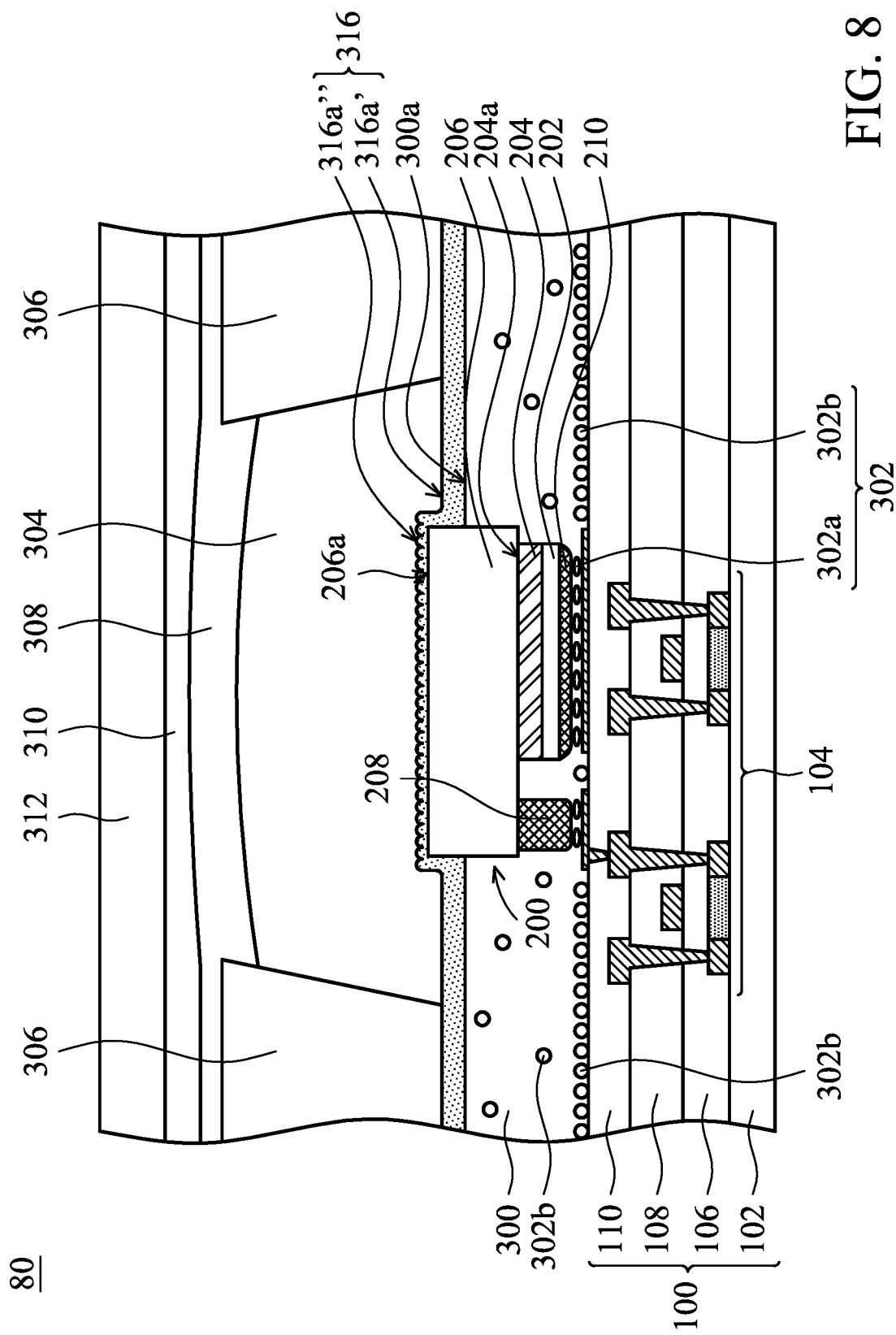
FIG. 8 illustrates the cross-sectional view of the display device in accordance with some embodiments of the present disclosure.

Next, FIG. 8 illustrates a cross-sectional view of the display device 80 in accordance with some embodiments of the present disclosure. The difference between the embodiments shown in FIG. 8 and FIG. 5A is that the top surface 316a" of the buffer layer 316 on the light-emitting unit 200 in the embodiment shown in FIG. 8 is rougher than the top surface 316a' of the buffer layer 316 on the first protective layer 300.

As shown in FIG. 8, in this embodiment, the top surface 316a of the buffer layer 316 may further include the top surface 316a" that is disposed above the light-emitting unit 200 and the top surface 316a' that is disposed above the first protective layer 300 and out of the light-emitting unit 200. As describe above, the top surface 316a" may be rougher than the top surface 316a'. In some embodiments, the surface roughness of the top surface 316a' may range from about 2 nm to about 30 nm. In some embodiments, the surface roughness of the top surface 316a" may range from about 5 nm to about 100 nm. In some embodiments, the difference of the surface roughness between the top surface 316a" and the top surface 316a' may range from about 3 nm to about 100 nm. In such a configuration, the light from the light-emitting unit 200 may be emitted more uniformly so that the conversion efficiency of the wavelength conversion layer 304 may be increased.

In some embodiments of the present disclosure, the rough top surface 316a" may be formed by an etching process. The etching process may include dry etching process or wet etching process.

Figure 9A:
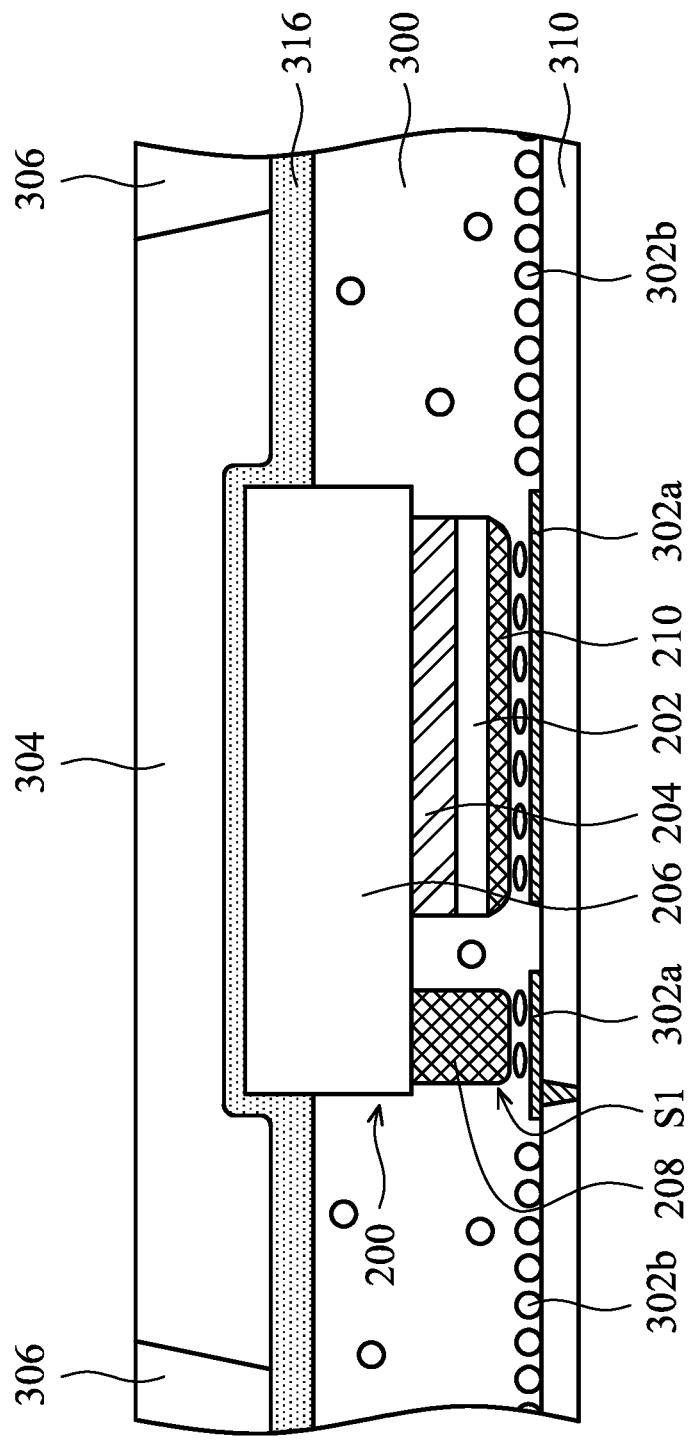
FIG. 9A illustrates a partially enlarged portion of the display device as shown in FIG. 5A.

Next, FIG. 9A illustrates a partially enlarged portion of the display device 50 in FIG. 5A. As shown in FIG. 9A, the conductive elements 302 may include the first conductive elements 302a and the second conductive elements 302b. The first conductive elements 302a may be disposed underneath the first terminal S1 of the light-emitting unit 200. The first conductive elements 302a may be disposed between the light-emitting unit 200 and the second insulating layer 110. In particular, some of the first conductive elements 302a may be disposed between the first electrode 208 and the contact structures (e.g., the conductive pads) on the second insulating layer 110; and some of the first conductive elements 302a may be disposed between the second electrode 210 and the contact structures (e.g., the conductive pads) on the second insulating layer 110. On the other hand, the second conductive elements 302b may be disposed in the region out of the light-emitting unit 200. The second conductive elements 302b may be dispersed in the first protective layer 300 or disposed at the top surface 110a of the second insulating layer 110.

In accordance with some embodiments of the present disclosure, a height-to-width ratio of the first conductive element 302a ranges from about 0.25 to about 0.75 or from about 0.4 to about 0.6. However, it should be noted that the height-to-width ratio of the first conductive element 302a should not be too small, or the contact yield will dramatically decrease; and the height-to-width ratio of the first conductive element 302a should not be too great, or the contact resistance will be too high due to the contact area of a single conductive element 302a is too low.

In accordance with some embodiments of the present disclosure, a height-to-width ratio of the second conductive element 302b ranges from about 0.7 to about 1.3 or from about 0.8 to about 1.2. However, it should be noted that the height-to-width ratio of the second conductive element 302b should not be too small, or the light being reflected by the second conductive element 302b will be nonuniform; and the height-to-width ratio of the first conductive element 302a should not be too great, or the light being reflected by the second conductive element 302b will dramatically decrease.

It should be noted that the height-to-width ratio used herein is measured from the cross-sectional structure obtained from the conductive element 302. In particular, the variation of height-to-width ratio may be from about 0% to about 5% due to the process for obtaining the cross-sectional structure. In addition, the "height" of the height-to-width ratio is defined as the maximum height along a first direction of a cross-sectional structure obtained from the conductive element 302. The "width" of the height-to-width ratio is defined as the maximum width along a second direction of a cross-sectional structure obtained from the conductive element 302. The above first direction and the second direction are orthogonal to each other.

Figure 9B:
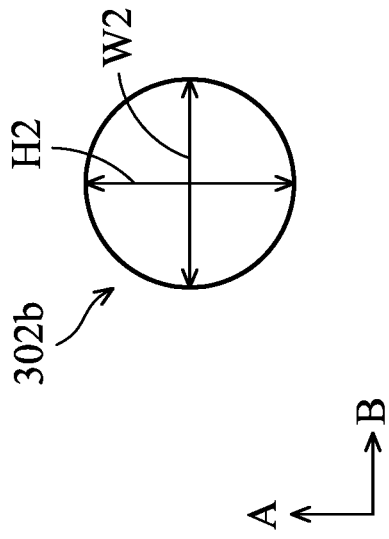
FIGS. 9B-9E illustrate the cross-sectional views of the first conductive element in accordance with some embodiments of the present disclosure.
Figure 9D:
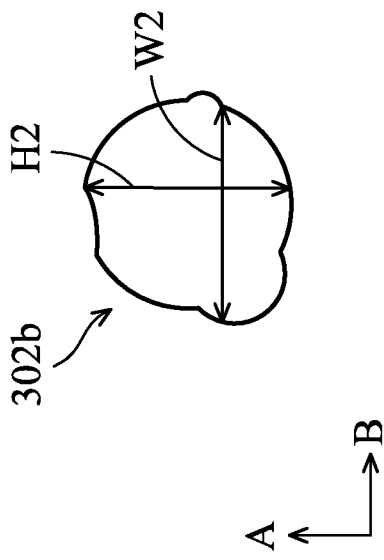
Figure 9C:
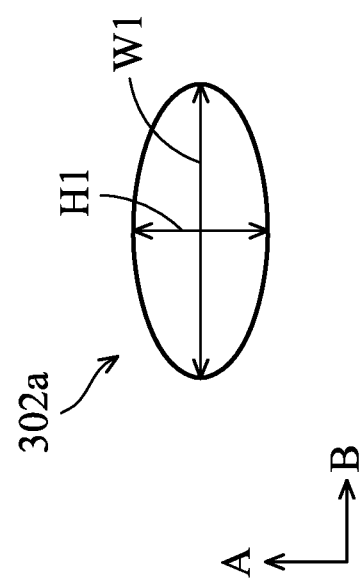

For example, FIG. 9B and FIG. 9C illustrate the cross-sectional views of the first conductive elements 302a in accordance with some embodiments of the present disclosure. Referring to FIG. 9B and FIG. 9C, the cross-sectional structure of the exemplary first conductive element 302a has a maximum height H1 along a first direction A and a maximum width W1 along a second direction B. The first direction A is orthogonal to the second direction B. In these examples, the height-to-width ratio of the first conductive element 302a is H1/W1. Moreover, as shown in FIG. 9B and FIG. 9C, the cross-sectional structure of the first conductive element 302a may have, but is not limited to, an ellipse shape or an ellipse-like shape.

Figure 9E:
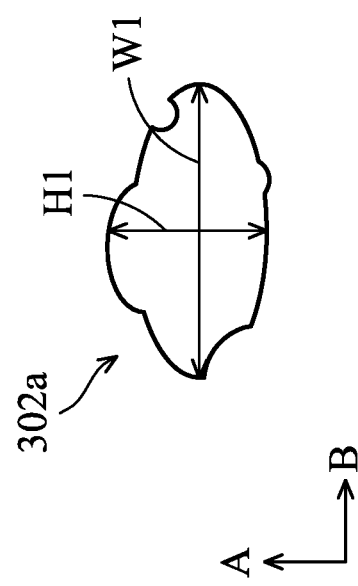

Next, FIG. 9D and FIG. 9E illustrate the cross-sectional views of the second conductive elements 302b in accordance with some embodiments of the present disclosure. As shown in FIG. 9D and FIG. 9E, the cross-sectional structure of the exemplary second conductive element 302b has a maximum height H2 along a first direction A and a maximum width W2 along a second direction B. The first direction A is orthogonal to the second direction B. In these examples, the height-to-width ratio of the second conductive element 302b is H2/W2. Moreover, the cross-sectional structure of the second conductive element 302b may have, but is not limited to, a circular shape or a circular-like shape.

To summarize the above, the display device provided in the present disclosure includes a protective layer having the elevation that is lower than the elevation of the upper semiconductor layer of the light-emitting unit. In such a configuration, less material is required for the protective layer compared to general display devices where the elevation of the protective layer is level with that of the upper semiconductor layer. In addition, there will be more space for the wavelength conversion layer, which is disposed over the protective layer, to fill in. In accordance with some embodiments of the present disclosure, the display device includes the protective layer having the elevation that is higher than the elevation of the quantum well of the light-emitting unit so as to prevent moisture and oxygen from damaging the quantum well. Furthermore, the protective layer of such a design may also prevent shorts or increase the reflectivity.

In addition, in accordance with some embodiments of the present disclosure, the display device includes a buffer layer disposed between the light emitting unit and the wavelength conversion layer so that the wavelength conversion layer may be unaffected by the current or heat produced by the light emitting-unit.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:
    a substrate;
    a driving circuit disposed on the substrate;
    a diode electrically connected to the driving circuit;
    a light shielding element overlapping the substrate;
    a protective layer disposed on the substrate; and
    a wavelength conversion layer overlapping the diode,
    wherein a surface of the light shielding element has a first width, a horizontal cross-section of a portion of the light shielding element has a second width, the second width is greater than the first width in a cross-sectional view, and the surface is closer to the substrate than the horizontal cross-section of the portion, and
    wherein the wavelength conversion layer and the protective layer respectively have curved surfaces in the cross-sectional view, and the protective layer covers top surfaces of the wavelength conversion layer and the light shielding element.

2. The electronic device as claimed in claim 1, wherein the driving circuit comprises a first thin-film transistor and a second thin-film transistor.

3. The electronic device as claimed in claim 2, wherein the diode overlaps a channel region of the first thin-film transistor.

4. The electronic device as claimed in claim 1, further comprising an organic layer disposed between the driving circuit and the diode.

5. The electronic device as claimed in claim 1, wherein the light shielding element comprises a black matrix material.

* * * * *